(12) United States Patent
Biwa et al.

(10) Patent No.: US 8,946,764 B2
(45) Date of Patent: Feb. 3, 2015

(54) GALLIUM NITRIDE-BASED SEMICONDUCTOR ELEMENT, OPTICAL DEVICE USING THE SAME, AND IMAGE DISPLAY APPARATUS USING OPTICAL DEVICE

(75) Inventors: Goshi Biwa, Kanagawa (JP); Ippei Nishinaka, Kanagawa (JP); Hiroyuki Okuyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 901 days.

(21) Appl. No.: 12/138,250

(22) Filed: Jun. 12, 2008

(65) Prior Publication Data

US 2009/0008648 A1    Jan. 8, 2009

(30) Foreign Application Priority Data

Jul. 3, 2007  (JP) ................................ 2007-174789

(51) Int. Cl.
  *H01L 33/00*   (2010.01)
  *H01L 33/32*   (2010.01)
  *H01L 33/02*   (2010.01)
  *H01L 27/144*  (2006.01)
  (Continued)

(52) U.S. Cl.
  CPC .............. *H01L 33/32* (2013.01); *H01L 33/025* (2013.01); *H01L 27/1446* (2013.01); *H01L 27/156* (2013.01); *H01L 31/0304* (2013.01)
  USPC ............................... 257/102; 257/101; 438/37

(58) Field of Classification Search
  USPC ................. 257/78, 86, 88, 101, 102
  See application file for complete search history.

(56) References Cited

U.S. PATENT DOCUMENTS 5,789,766 A * 8/1998 Huang et al. ..................... 257/88
6,514,782 B1   2/2003 Wierer, Jr. et al.
(Continued)

FOREIGN PATENT DOCUMENTS

JP   HEI 11-214746   8/1999
JP   2000-332288     11/2000
(Continued)

OTHER PUBLICATIONS

T.Akasaka, H.Gotoh, T.Saito, and T.Makimoto, "High luminescent efficiency of InGaN multiple quantum wells grown on InGaN underlying layers," Appl.Phys.Lett., vol. 85, pp. 3089-3091 (2004).
(Continued)

*Primary Examiner* — Mark Tornow
(74) *Attorney, Agent, or Firm* — K&L Gates LLP

(57) ABSTRACT

A GaN-based semiconductor element which can suppress a leakage current generated during reverse bias application, an optical device using the same, and an image display apparatus using the optical device are provided. The GaN-based semiconductor element has a first GaN-based compound layer including an n-type conductive layer; a second GaN-based compound layer including a p-type conductive layer; and an active layer provided between the first GaN-based compound layer and the second GaN-based compound layer. In this GaN-based semiconductor element, the first GaN-based compound layer includes an underlayer having an n-type impurity concentration in the range of $3 \times 10^{18}$ to $3 \times 10^{19}$/cm$^3$, and when a reverse bias of 5 V is applied, a leakage current density, which is the density of a current flowing per unit area of the active layer, is $2 \times 10^{-5}$ A/cm$^2$ or less.

13 Claims, 13 Drawing Sheets

(51) Int. Cl.
*H01L 27/15* (2006.01)
*H01L 31/0304* (2006.01)

(56) References Cited

U.S. PATENT DOCUMENTS

| | | | |
|---|---|---|---|
| 6,635,904 B2 | 10/2003 | Goetz et al. | |
| 6,667,498 B2* | 12/2003 | Makimoto et al. | 257/183 |
| 2002/0010899 A1 | 1/2002 | Wallace | |
| 2002/0171092 A1 | 11/2002 | Goetz et al. | |
| 2002/0175341 A1 | 11/2002 | Biwa et al. | |
| 2002/0195619 A1* | 12/2002 | Makimoto et al. | 257/197 |
| 2003/0010993 A1* | 1/2003 | Nakamura et al. | 257/99 |
| 2004/0155248 A1 | 8/2004 | Fukuda et al. | |
| 2005/0236631 A1* | 10/2005 | Lee | 257/81 |
| 2006/0278886 A1 | 12/2006 | Tomoda et al. | |
| 2007/0187713 A1* | 8/2007 | Kim | 257/103 |

FOREIGN PATENT DOCUMENTS

| | | |
|---|---|---|
| JP | 2001-203386 | 7/2001 |
| JP | 2001-237458 | 8/2001 |
| JP | 2002-299685 | 10/2002 |
| JP | 2002-319702 | 10/2002 |
| JP | 2003-59938 | 2/2003 |
| JP | 2004-096077 | 3/2004 |
| JP | 2004-112002 | 4/2004 |
| JP | 2006-156733 | 6/2006 |
| JP | 2007-80996 | 3/2007 |
| JP | 2007-165613 | 6/2007 |
| JP | 2007-19467 | 10/2007 |

OTHER PUBLICATIONS

S. Keller et al.,"Effect of the growth rate and the barrier doping on the morphology and the properties of InG a N/G a N quantum wells," J. Cryst. Growth. 195(1998)258-264.

H. Kim et al.,"Electromigration-induced failure of G a N multi-quantum well light emitting diode," Electronics Letters vol. 36 No. 1 O(2000).

X.A. Cao et al.,"Microstructure origin of leakage current InG a N/InG a N light-emitting diodes," J. Cryst. Growth. 264 (2004) 1 72-1 77.

D.L.Rode et al.,"Electron Hall mobility of n-GaN," Appl.Phys.Lett., 66(15), pp. 1972-1973 (1 995).

M.A. di Forte-Poisson et al., "Relationship between physical properties and gas purification in GaN grown by metalorganic vapor phase epitaxy," J. Cryst. Growth. 195(1998)3 14-3 18.

Japanese Patent Office, Notice of reasons for refusal, issued in connection with Japanese Patent Application No. 2007-174789, dated Apr. 24, 2012. (3 pages).

Japanese Patent Office, Decision of refusal issued in connection with Japanese Patent Application No. 2007-174789, dated Sep. 18, 2012. (4 pages).

Japanese Office Action issued Dec. 13, 2011, for corresponding Japanese Appln. No. 2007-174789.

* cited by examiner

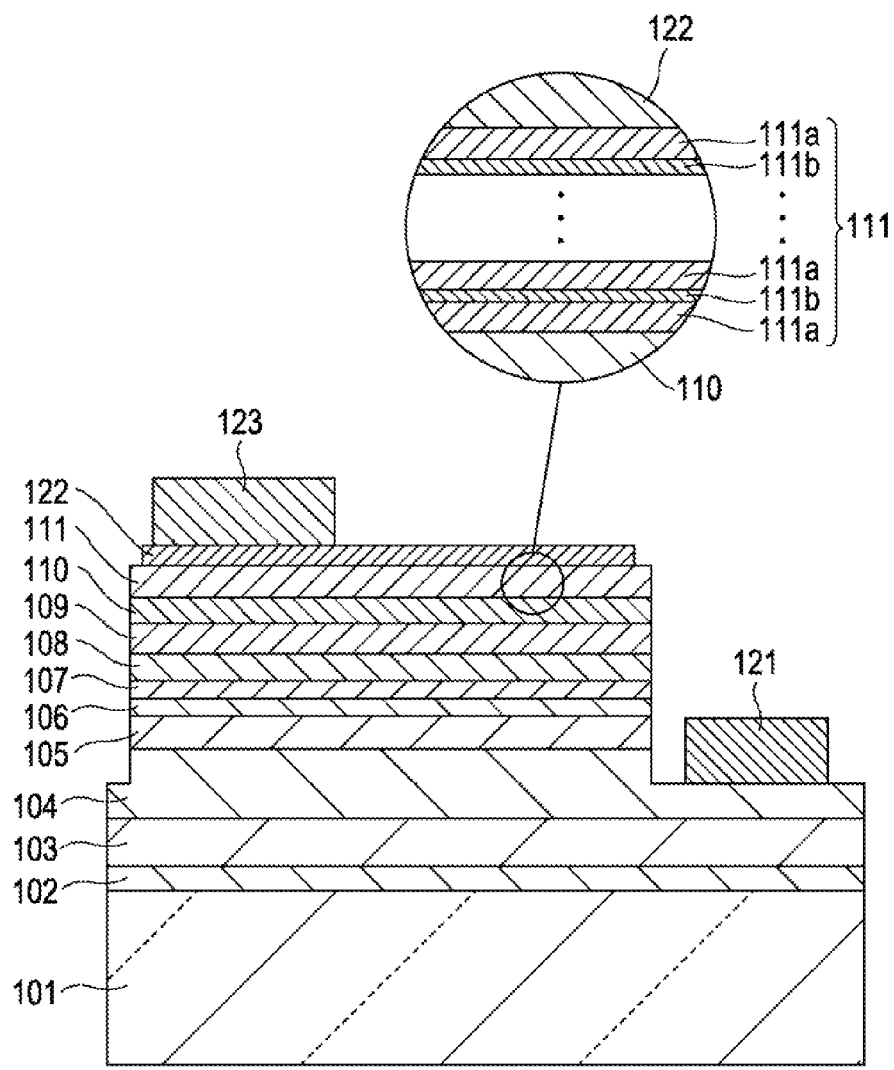

GALLIUM NITRIDE-BASED SEMICONDUCTOR ELEMENT, OPTICAL DEVICE USING THE SAME, AND IMAGE DISPLAY APPARATUS USING OPTICAL DEVICE

CROSS REFERENCES TO RELATED APPLICATIONS

The present application claims priority to Japanese Patent Application JP 2007-174789 filed in the Japanese Patent Office on Jul. 3, 2007, the entire contents of which are incorporated herein by reference.

BACKGROUND

The present application relates to a gallium nitride-based semiconductor element, an optical device using the same, and an image display apparatus using the optical device.

A light-emitting element (GaN-based semiconductor light-emitting element) including an active layer composed of a gallium nitride (GaN) compound semiconductor can realize a wide light-emission wavelength range from ultraviolet to infrared by controlling bandgap energy using a mixed crystal composition and/or the thickness of the active layer. GaN-based semiconductor light-emitting elements which emit various colors have already been commercially available and have been used in various applications, such as an image display apparatus, a lighting device, a light source for an inspection device, a light source for a disinfection device, and a light source for a medical inspection device. In addition, a semiconductor laser and a light-emitting diode (LED), which emit violet color, have also been developed and have already been used as a pickup for writing and reading data on a large capacity optical disc.

In general, a GaN-based semiconductor light-emitting element has a structure including a first GaN-based compound semiconductor layer having an n-type conductivity, an active layer, and a second GaN-based compound semiconductor layer having a p-type conductivity laminated in that order on a substrate.

Hereinafter, a GaN-based semiconductor light-emitting element of a related art will be described.

The following has been disclosed by S. Keller et al., "Effect of the growth rate and the barrier doping on the morphology and the properties of InGaN/GaN quantum wells," J. Cryst. Growth. 195, (1998), pp. 258 to 264 (3.2 Effect of the silicon doping during LT GaN~) (hereinafter referred to as "Non-Patent Document 1).

A Si doping concentration of a GaN barrier was changed from 0 to $3\times10^{19}/cm^3$. In addition to a slight decrease in superlattice period concomitant with an increase in Si doping concentration of the barrier, by a high resolution x-ray diffraction analysis, a significant decrease in full-width at half maximum was confirmed for both a first-order and a second-order superlattice peak. That is, by increasing the Si doping concentration of a multi-quantum well from 0 to $3\times10^{19}/cm^3$, the full-width at half maximum of the first-order superlattice peak was decreased from 312 to 212 arcsec, and the full-width at half maximum of the second-order superlattice peak was decreased from 589 to 234 arcsec.

By H. Kim et al., "Electromigration-induced failure of GaN multi-quantum well light emitting diode," Electronics Letters, Vol. 36, No. 10 (2000), pp 908 to 910 (summary) (hereinafter referred to as "Non-Patent Document 2), it has been disclosed that the life of a GaN multi-quantum well (MQW) LED can be extrapolated by using an electromigration-induced failure model.

In Japanese Unexamined Patent Application Publication No. 2001-203386 (paragraphs 0008 and 0018, and FIG. 6) (hereinafter referred to as "Patent Document 1") titled "III-nitride light-emitting device enhancing light generation ability", the following has been disclosed.

The invention of the Patent Document 1 relates to an inversion type III-nitride light-emitting device (LED) having a high light generation ability as a whole. The device of a large area (>400×400 µm$^2$) has at least one n electrode, and the n electrode is provided to surround metallization of a p electrode, so that a series resistance is decreased. The metallization of the p electrode is opaque and has a high reflectivity, ohmic properties, and superior current diffusivity. In order to obtain an electrical and a thermal connection between an LED chip and a package, an intermediate material, that is, a lower mount, can be used. This device can include a superstrate structure having a high refractive index (n>1.8) so as to improve a light-extraction efficiency.

According to Patent Document 1, by decreasing a thermal resistance from a pn junction to a lightning package while a light-extraction amount is increased, a high output LED is provided which has a large area, such as more than 400×400 µm$^2$, and a significantly high light generation ability. According to the invention of the Patent Document 1, in order to realize the above LED, an inversion structure including an opaque p electrode having a low resistance and a high reflectance is used.

The following technique has been disclosed in Japanese Unexamined Patent Application Publication No. 2001-237458 (paragraphs 0009 and 0029, and FIG. 6) (hereinafter referred to as "Patent Document 2") titled "Method for manufacturing group III nitride LED having enhanced light-emission ability".

The invention of the Patent Document 2 relates to an inversion type group III nitride light-emitting device (LED) having an enhanced entire light-emission ability. This device of a large area (>400×400 µm$^2$) has at least one n electrode surrounded by a p electrode metal cover so as to obtain a low series resistance. The p electrode metal cover is opaque and has a high reflectance, ohmic properties, and superior current diffusivity. An intermediate material or a lower mount may be used to prepare an electrical and a thermal connection between the LED and a package. This device may include an upper-layer substrate having a high refractive index (n>1.8) which can obtain a further improvement in light-extraction efficiency.

According to Patent Document 2, since a thermal resistance from a pn junction to a lamp package is decreased while light extraction is enhanced, a high power LED having a maximum light-emission ability and a large area, such as more than 400×400 µm$^2$, can be provided. In order to realize this LED, the invention of the Patent Document 2 uses an inversion structure incorporating an opaque p electrode having a low resistance and a high reflectance.

In Japanese Unexamined Patent Application Publication No. 2002-299685 (paragraphs 0004, 0009 and 0010, and 0031, and FIGS. 1 and 3) (hereinafter referred to as "Patent Document 3") titled "Indium gallium nitride smooth structure for group III nitride device", the following technique has been disclosed.

According to Patent Document 3, an inclined smooth region containing indium, which is prepared for growth in an active region, is formed between a substrate and an active region of a group III nitride light-emitting device. In one embodiment of this invention, the inclined smooth region has an inclined composition. In another embodiment, the inclined smooth region has an inclined dopant concentration. In several embodiments, the inclined smooth region is separated from the active region by a spacer layer having a constant composition and dopant concentration. The inclined smooth region of the invention according to the Patent Document 3 can improve surface properties of a layer grown on the inclined smooth region, in particular, on the active region.

In Patent Document 3, a smooth layer is highly doped as compared to the spacer layer. The smooth layer is doped with Si at a concentration, for example, in the range of $2\times10^{17}$ to $2\times10^{19}/cm^3$. In the first embodiment, the spacer layer is an n-type layer doped with Si at a concentration, for example, in the range of 0 to $2\times10^{18}/cm^3$.

The spacer layer of the first embodiment has a lower dopant concentration than that of an n-type region 12; hence, the spacer layer is a layer having a higher resistance, which can help current to uniformly spread in the active region and can prevent the current from concentrating at a shortest path between an n contact and a p contact. The thickness of the spacer layer is selected in accordance with the dopant concentration thereof so that the spacer layer does not remarkably increase a forward voltage of the device.

According to Patent Document 3, the indium-containing smooth structure has several advantages. First of all, by using the smooth structure, even after undesired three-dimensional growth in an island shape starts, a two-dimensional step-flow type growth on a smooth semiconductor surface can be recovered. The three-dimensional growth in an island shape may be induced by large misalignment of a substrate surface or an insufficient surface treatment, or may be induced at a growth initiation step, which is designed to decrease a crystalline dislocation density, such as silicon implantation. As described above, the surface condition has influence on the device properties, and the smooth structure can improve both efficiency and reliability of a group III nitride LED.

In Japanese Unexamined Patent Application Publication No. 2002-319702 (paragraphs 0016 and 0017) (hereinafter referred to as "Patent Document 4") titled "Method for manufacturing nitride semiconductor element and nitride semiconductor element", the following technique has been disclosed.

The nitride semiconductor element of Patent Document 4 has a first nitride semiconductor layer, an active layer laminated thereon, and a second nitride semiconductor layer laminated on the active layer and having an opposite conductivity to that of the first nitride semiconductor layer, in which a growth temperature of the second nitride semiconductor layer is set to 900° C. or less, and the second nitride semiconductor has a thickness forming a smooth surface.

When the nitride semiconductor layer is a gallium nitride layer, although a gallium nitride layer grown at approximately 950° C. is generally liable to form growth pits, when it is grown at a lower temperature of 900° C. or less, since a surface diffusion length of a group III element is decreased, a flat film having a small number of growth pits can be obtained. As a result, when a device is formed, for example, a decrease in leakage current can be realized.

In Japanese Unexamined Patent Application Publication No. 2003-59938 (paragraphs 0062 to 0067, and FIG. 14) (hereinafter referred to as "Patent Document 5") titled "Nitride semiconductor laminate and semiconductor element thereof", the following technique has been disclosed.

FIG. 13 is a view illustrating an LED element of a related art and corresponds to FIG. 14 of the Patent Document 5.

Example 3 of the Patent Document 5 will be described in which Patent Document 5 is applied to a light-emitting diode (LED) formed of a nitride semiconductor. FIG. 13 is a view showing the structure of an LED to which the invention of the Patent Document 5 is applied, in which reference numeral 241 indicates a SiC substrate, 242 indicates an AlN buffer layer (100 nm), 243 indicates a Si-doped GaN layer (1 µm), 244 indicates an InGaN graded layer (30 nm), 245 indicates an undoped InGaN/GaN superlattice (active layer), 246 indicates an InGaN graded layer (30 nm), 247 indicates an Mg-doped GaN layer (500 nm), 248 indicates an Al/Au electrode, and 249 indicates a Pd/Au electrode.

In a manner similar to that of Example 1, after an epitaxial structure was formed on the SiC substrate 241 by a metal-organic vapor phase epitaxial (MOVPE) method, etching was performed by an electron cyclotron resonance (ECR) etching method, and electrodes were then formed by electron beam deposition. The active layer 245 was an InGaN/GaN superlattice, the In composition of a barrier layer of this superlattice was 6%, and the In composition of a well layer was 10%. The thickness of the barrier layer and that of the well layer were 5 nm and 2 nm, respectively, and the number of the well layers was 5. The In composition of the InGaN layer 244 inserted between the n-type impurity layer 243 and the active layer 245 was increased from 0% to 6% from the n-type impurity layer 243 to the active layer 245. By the structure described above, the bandgap was gradually decreased from the substrate side to the surface side.

In addition, the In composition of the InGaN layer 246 inserted between the active layer 245 and the p-type impurity layer 247 was decreased from 6% to 0% from the active layer 245 to the p-type impurity layer 247. By the structure described above, the bandgap was gradually increased from the substrate side to the surface side. The thicknesses of the two InGaN graded layers 244 and 246 were fixed to 30 nm. In addition, for the InGaN graded layer 244 inserted between the n-type impurity layer 243 and the active layer 245, a structure in which no Si impurity, which is an n-type impurity, was doped and a structure in which a Si impurity at a concentration of $1\times10^{18}/cm^3$ was doped were formed.

In addition, for the InGaN graded layer 246 inserted between the active layer 245 and the p-type impurity layer 247, a structure in which no Mg impurity, which is a p-type impurity, was doped and a structure in which an Mg impurity at a concentration of $1\times10^{18}/cm^3$ was doped were formed.

By applying a voltage to these two structures, each LED is driven to emit light. By using the invention of the Patent Document 5, when an n-type or a p-type impurity at a concentration of $1\times10^{18}/cm^3$ was doped in the InGaN graded layer 244 or 246, the light-emission output could be increased even at a low voltage. Furthermore, when both doping of an n-type impurity (Si) and a p-type impurity (Mg) are performed, light emission can be performed at a low voltage of 3V or less.

In Japanese Unexamined Patent Application Publication No. 2004-112002 (paragraphs 0011 and 0012, and FIG. 1) (hereinafter referred to as "Patent Document 6") titled "Nitride semiconductor element", the following technique has been disclosed.

FIG. 14 is a view illustrating a GaN semiconductor element (LED element) of a related art and corresponds to FIG. 1 of the Patent Document 6.

FIG. 14 is a schematic cross-sectional view showing the structure of a nitride semiconductor element (LED element) of one embodiment of the invention according to the Patent Document 6. The nitride semiconductor element of this embodiment is formed of (1) a buffer layer 102 of AlGaN, (2) an undoped GaN layer 103, (3) an n-type contact layer 104 of Si-doped GaN, (4) an undoped GaN layer 105, (5) a Si-doped GaN layer 106, (6) an undoped GaN layer 107, (7) a GaN/InGaN superlattice n-type layer 108, (8) an active layer 109 having a multi-quantum well structure in which InGaN layers and GaN layers are provided as a well layer and a barrier layer, respectively, (9) a p-AlGaN/p-InGaN superlattice p-type layer 110, and (10) an Mg-doped GaN/Si-doped GaN modulated doped p-side contact layer 111 provided in that order on a sapphire substrate 101, and in addition, a p-side and an n-side electrode are formed as described below.

For example, after a corner of the element from the p-side contact layer 111 to the undoped GaN layer 105 is removed by etching so as to expose part of the n-contact layer 104, an n-ohmic electrode 121 is formed on the exposed part of the n-type contact layer 104.

In addition, as the p-side electrode, after a p-ohmic electrode 122 is formed almost all over the p-side contact layer 111, a p-pad electrode 123 is formed on part of the p-ohmic electrode 122.

The nitride semiconductor element of this embodiment is particularly characterized in that the p-side contact layer 111 is formed of a modulated doped layer obtained by alternately laminating an Mg-doped GaN layer 111a and a Si-doped GaN layer 111b; hence, a leakage current is decreased, and an electrostatic withstand voltage is improved.

In this embodiment, a preferable Si doping concentration of the p-side contact layer 111 (Si-doped GaN layer 111b) is set in the range of $1\times10^{17}$ to $1\times10^{21}/cm^3$, and more preferably in the range of $1\times10^{18}$ to $5\times10^{19}/cm^3$. The reasons for this are that when the concentration is $1\times10^{17}/cm^3$ or more, a significant effect of decreasing a leakage current can be obtained, and when the concentration is more than $1\times10^{21}/cm^3$, the crystallinity is degraded, and the light-emission efficiency is liable to be degraded.

By X. A. Cao et al., "Microstructure origin of leakage current InGaN/InGaN light-emitting diodes," J. Cryst. Growth. 264, (2004), pp. 172 to 177 (3. Results and discussion, FIGS. 2(a) and 2(b)) (hereinafter referred to as "Non-Patent Document 3), typical reverse I-V characteristics of LED when the temperature is increased (FIG. 2(a)) and a proportional relationship of leakage current to an active layer area function area) (FIG. 2(b)) have been disclosed. In addition, according to the Non-patent Document 3, it is confirmed that a relationship of topography to a current image corresponds to a relationship of V-defects with associated mixed dislocation or screw dislocation to a highly localized junction leakage current at a low bias application.

By T. Akasaka et al., "High luminescent efficiency of InGaN multiple quantum wells grown on InGaN underlying layers," App. Phys. Lett. Vol. 85, No. 15 (2004), pp 3089 to 3091 (lines 29 to 36 of the left column of page 3089, and line 19 of the right column of page 3089 to line 1 of the left column of page 3090) (hereinafter referred to as "Non-Patent Document 4), the following technique has been disclosed.

By an InGaN underlayer having a thickness of approximately 50 nm, the number of nonradiative recombination centers of an InGaN multi-quantum well was significantly decreased, and as a result, although the internal quantum efficiency ($\eta_{int}$) of photoluminescence (PL) at room temperature, which has been reported, was approximately 0.3, a sufficiently high internal quantum efficiency ($\eta_{int}$) of 0.71 was obtained by the InGaN multi-quantum well which emits ultraviolet light (approximately 400 nm). By using an underlayer having a thickness of 50 nm and doped with Si at a concentration of $2\times10^{18}/cm^3$, GaN grown at 1,000° C. using hydrogen, GaN grown at 780° C. using nitrogen, and $In_{0.04}Ga_{0.96}N$ grown at 780° C. using nitrogen were prepared.

In Japanese Unexamined Patent Application Publication No. 2007-80996 (paragraphs 0008 to 0010, and 0015) (hereinafter referred to as "Patent Document 7) titled "GaN-based semiconductor light-emitting element and method for manufacturing the same", the following has been disclosed.

An object Patent Document 7 is to provide a GaN-based semiconductor light-emitting element and a method for manufacturing the same, the GaN-based semiconductor light-emitting element being capable of achieving a high light-emission efficiency during operation at a high operation current density and, at the same time, of realizing a significant decrease in operation voltage.

A GaN-based semiconductor light-emitting element of a first embodiment of the Patent Document 7 has (A) a first GaN-based compound semiconductor layer having an n-type conductivity, (B) an active layer, and (C) a second GaN-based compound semiconductor layer having a p-type conductivity, and further has (D) an underlayer of a GaN-based compound semiconductor formed between the first GaN compound semiconductor layer and the active layer, and (E) a superlattice structure layer which is formed of a GaN-based semiconductor, which is provided between the active layer and the second GaN-based compound semiconductor layer, and which contains a p-type dopant.

A GaN-based semiconductor light-emitting element of a second embodiment of the Patent Document 7 in order to achieve the above object has (A) a first GaN-based compound semiconductor layer having an n-type conductivity, (B) an active layer, and (C) a second GaN-based compound semiconductor layer having a p-type conductivity, and further has (D) an underlayer of a GaN-based compound semiconductor formed between the first GaN-based compound semiconductor layer and the active layer, and the second GaN-based compound semiconductor layer has a superlattice structure.

In the GaN-based semiconductor light-emitting element of the first or the second embodiment of the Patent Document 7 including the preferable structure and configuration described above, the underlayer may be provided directly in contact with the active layer, or the structure may be formed in which a lower spacer layer of an undoped GaN-based compound semiconductor is formed between the active layer and the underlayer, and the lower spacer layer has a thickness of 50 nm or less and preferably 20 nm or less. In addition, the thickness of the underlayer is 20 nm or more and preferably 50 nm or more. In addition, as the upper limit of the thickness of the underlayer, a thickness of 1 μm may be mentioned by way of example. Furthermore, it is preferable that the underlayer and the active layer include In, and the In composition of the underlayer be 0.005 or more and be lower than that of the active layer. In addition, it is preferable that the underlayer contain an n-dopant (such as Si), and the concentration of the n-type dopant be in the range of $1\times10^{16}$ to $1\times10^{21}/cm^3$, and more preferably in the range of $2\times10^{17}$ to $2\times10^{19}/cm^3$. The underlayer may be basically formed of a single composition or may have a composition which gradually changes. In addition, the underlayer is preferably transparent to light-emission wavelengths.

SUMMARY

In a light-emitting element (light-emitting diode or laser diode) having a pn structure of a GaN-based compound semiconductor, a leakage current may be generated during reverse bias application, and in addition, in a photodetector (or a light-receiving element) using a GaN-based compound semiconductor, when light is not irradiated to an active layer during no bias or reverse bias application, a dark current may be generated in some cases.

The leakage current in a light-emitting element may cause, for example, an increase in power consumption and/or a circuit malfunction by unintentional current flow, and in an optical device in which a large number of light-emitting elements are mounted, crosstalk may disadvantageously occur thereby. In addition, the dark current in a light-receiving element may disadvantageously degrade a signal/noise S/N ratio of a photodetector (light-receiving device).

In a light-emitting element having a pn structure of a GaN-based compound semiconductor, in order to maintain stable and preferable operation properties, it has been strongly desired to suppress a leakage current generated during reverse bias application, to prevent circuit malfunction and an increase in power consumption, which are caused by the generation of a leakage current, and to suppress crosstalk in an optical device in which many light-emitting elements are mounted.

As the causes of the generation of a leakage current in a light-emitting element and that of a dark current in a light-receiving element, V-defects generated in a GaN-based compound semiconductor crystal and mixed dislocation and/or screw dislocation associated therewith may be mentioned.

In the past, it has been known that the leakage current can be decreased by using a substrate having a low dislocation density, such as a substrate which is formed by lateral direction growth on a sapphire substrate using selective growth or a bulk GaN substrate; however, in order to decrease the leakage current, it is necessary to use a particular substrate as described above, and as a result, cost reduction has not be easily achieved.

When a device is formed using a light-emitting element (LED), there have been a method for forming pn electrodes on one surface and a method for forming electrodes on a top and a bottom surface by peeling off a sapphire substrate or the like or by using a conductive substrate. When the pn electrodes are formed on one-side surface, for example, a semitransparent p-type electrode or a flip-chip type using a reflective electrode may be used. In both cases, when a large active layer area is used, a drive current density is decreased, and a high efficiency can be expected; however, concomitant with the increase in active layer area, the leakage current may become a problem.

In addition, in the method for forming electrodes on a top and a bottom surface by using a conductive substrate or by peeling off a sapphire substrate or the like, it is not necessary to mill an active layer by etching to form one electrode, and almost the entire chip surface can be used as the active layer (junction area). By this method, since a larger active layer area can be ensured even if its chip external dimension is the same as that of another type of chip, the process can be simplified, and at the same time, a high efficiency can be effectively obtained; however, the problem similar to that described above may also arise.

In addition, since a GaN-based semiconductor light-emitting element (hereinafter also referred to as "GaN-based light-emitting element") may not only have various package forms but also have various sizes depending on application and light quantity, and a standard drive current (operation current) also varies depending on the size of the GaN-based light-emitting element, it is difficult to directly compare current dependences of properties of GaN-based light-emitting elements.

Hereinafter, for easy comparison purposes, instead of using the drive current value itself of a GaN-based light-emitting element, a drive current density (unit: $A/cm^2$) obtained by dividing the drive current value by an active layer area (junction region area) will be used. In a manner similar to that described above, instead of using the leakage current value itself of a GaN-based light-emitting element, a leakage current density (unit: $A/cm^2$) obtained by dividing the leakage current value by the active layer area will be used. In addition, in a manner similar to that described above, as for a dark current relating to a GaN-based semiconductor light-receiving element, a dark current density (unit: $A/cm^2$) obtained by dividing the dark current value by the active layer area will be used.

Hereinafter, although a GaN-based semiconductor element having a pn structure is formed as a light-emitting element or a light-receiving element, when the GaN-based semiconductor element is described, regardless of whether the element is a light-emitting element or a light-receiving element, a current generated when a reverse bias is applied to the GaN-based semiconductor element is called a "leakage current".

It is believed that the leakage current of a GaN-based semiconductor element having a pn structure relates to a impurity concentration doped in a GaN-based compound semiconductor; however, researches have not be reported which confirmed the above relationship by actual measurement. In particular, in a light-emitting element in which an active layer is formed between a first GaN-based compound layer including an n-type conductive layer and a second GaN-based compound layer including a p-type conductive layer, research has not been reported which confirmed the relationship (doping concentration dependence) between the concentration of an n-type dopant (such as Si) contained in the above n-type conductive layer and the leakage current of the light-emitting element by actual measurement.

Si doping at a concentration in the range of $2\times10^{17}$ to $2\times10^{19}/cm^3$ has been disclosed in the Patent Document 3; Si doping at a concentration of $2\times10^{18}/cm^3$ has been disclosed in the Non-Patent Document 4; an n-type doping concentration being preferably in the range of $1\times10^{16}$ to $1\times10^{21}/cm^3$ and more preferably in the range of $2\times10^{17}$ to $2\times10^{19}/cm^3$ has been disclosed in the Patent Document 7; a Si doping concentration being changed from 0 to $3\times10^{19}/cm^3$ has been disclosed in the Non-Patent Document 1; and the formation of a structure in which Si was doped at a concentration of $1\times10^{18}/cm^3$ has been disclosed in the Patent Document 3. However, in all the documents described above, in a light-emitting element, the relationship between the n-type dopant concentration of the n-type conductive layer and the leakage current have not been investigated, problems generated in an optical device formed of many light-emitting elements connected by common wiring have not been taken into consideration, and a light-receiving element has not been discussed at all.

Although the Patent Document 6 has disclosed a preferable doping concentration in the p-side contact layer, in the light-emitting element, the relationship between the n-type dopant concentration of the n-type conductive layer and the leakage current have not been investigated, problems generated in an optical device formed of many light-emitting elements connected by common wiring have not been taken into consideration, and a light-receiving element has not been discussed at all.

When a device is formed using a light-emitting element (LED), there have been a method for forming pn electrodes on one surface and a method for forming electrodes on a top and a bottom surface by peeling off a sapphire substrate or the like or by using a conductive substrate. When the pn electrodes are formed on one-side surface, for example, a semitransparent p-type electrode or a flip-chip type using a reflective electrode may be used. In both cases, when a large active layer area is used, a drive current density is decreased, and a high efficiency can be expected; however, concomitant with the increase in active layer area, the leakage current may become a problem.

In addition, in the method for forming electrodes on a top and a bottom surface by using a conductive substrate or by peeling off a sapphire substrate or the like, it is not necessary to mill an active layer by etching to form one electrode, and almost the entire chip surface can be used as the active layer (junction area). By this method, since a larger active layer area can be ensured even if its chip external dimension is the same as that of another type of chip, the process can be simplified, and at the same time, a high efficiency can be effectively obtained; however, the problem similar to that described above may also arise.

The present application has been conceived to solve the problems described above, and hence it is desirable to provide a gallium nitride (GaN)-based semiconductor element that can suppress a leakage current generated during reverse bias application, an optical device using the same, and an image display apparatus using this optical device.

That is, according to an embodiment, a gallium nitride-based semiconductor element is provided which includes: a first GaN-based compound layer including an n-type conductive layer; a second GaN-based compound layer including a p-type conductive layer; and an active layer provided between the first GaN-based compound layer and the second GaN-based compound layer, wherein the first GaN-based compound layer includes an underlayer having an n-type impurity concentration in the range of $3\times10^{18}$ to $3\times10^{19}/cm^3$, and when a reverse bias of 5 V is applied, a leakage current density, which is the density of a current flowing per unit area of the active layer, is $2\times10^{-5}$ A/cm$^2$ or less.

In addition, according to another embodiment, an optical device is provided which includes: a plurality of gallium nitride-based semiconductor elements, each of which is the gallium nitride-based semiconductor element described above, arranged in a two-dimensional matrix, wherein first electrodes of the gallium nitride-based semiconductor elements disposed along lines in a first direction are connected to common wires of the respective lines in the first direction, and second electrodes of the gallium nitride-based semiconductor elements disposed along lines in a second direction are connected to common wires of the respective lines in the second direction.

Furthermore, according to still another embodiment, an image display apparatus is provided which includes: a pixel portion including the above optical device, wherein the gallium nitride-based semiconductor elements are passive matrix driven.

Since the gallium nitride-based (hereinafter referred to as "GaN-based") semiconductor element of the embodiment includes: a first GaN-based compound layer including an n-type conductive layer; a second GaN-based compound layer including a p-type conductive layer; and an active layer provided between the first GaN-based compound layer and the second GaN-based compound layer, and since the first GaN-based compound layer includes an underlayer having an n-type impurity concentration in the range of $3\times10^{18}$ to $3\times10^{19}/cm^3$, when a reverse bias of 5 V is applied, a leakage current density, which is the density of a current flowing per unit area of the active layer, can be decreased to $2\times10^{-5}$ A/cm$^2$ or less, the leakage current can be suppressed, properties can be prevented from being degraded caused by crosstalk, an increase in power consumption is suppressed, and circuit malfunction can be prevented, so that stable and preferable operation properties can be maintained.

Since the optical device of an embodiment includes: the above gallium nitride-based semiconductor elements arranged in a two-dimensional matrix, in which first electrodes of the gallium nitride-based semiconductor elements disposed along lines in a first direction are connected to common wires of the respective lines in the first direction, and second electrodes of the gallium nitride-based semiconductor elements disposed along lines in a second direction are connected to common wires of the respective lines in the second direction, when a reverse bias is applied, the leakage current is suppressed. Hence, properties are prevented from being degraded caused by crosstalk, an increase in power consumption is suppressed, and circuit malfunction can be prevented, so that stable and preferable operation properties can be maintained.

According to the image display apparatus of the embodiment, since a pixel portion is formed by the above optical device, and the gallium nitride-based semiconductor elements are passive matrix driven, when a reverse bias is applied, due to the suppression of the leakage current, properties are prevented from being degraded caused by crosstalk, an increase in power consumption is suppressed, and circuit malfunction can be prevented, so that stable and preferable operation properties can be maintained.

Additional features and advantages are described herein, and will be apparent from the following Detailed Description and the figures.

BRIEF DESCRIPTION OF THE FIGURES

FIG. 14 is a view illustrating a GaN-based semiconductor element (LED element) of a related art.

DETAILED DESCRIPTION

Figure 1:
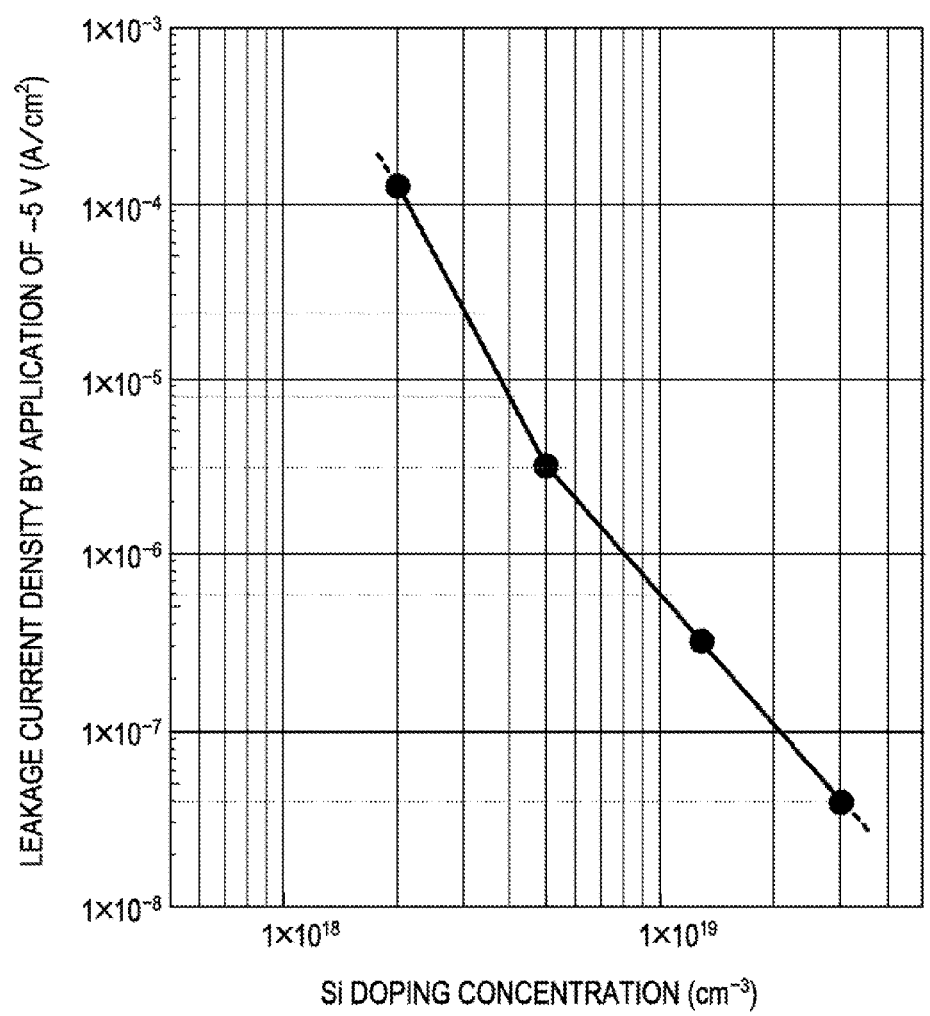
FIG. 1 is a graph showing the relationship between a doping concentration and a leakage current density of a GaN-based semiconductor light-emitting element of an embodiment.

In a GaN-based semiconductor element of an embodiment, the structure is preferably formed so that the n-type impurity concentration of the underlayer is $4\times10^{18}/cm^3$ or more, and the leakage current density is $8\times10^{-6}$ A/cm$^2$ or less. By this structure, when a reverse bias is applied, since the leakage current is suppressed, an increase in power consumption is suppressed, degradation of properties caused by crosstalk is prevented, and circuit malfunction can be prevented, so that stable and preferable operation properties can be maintained.

In addition, the structure is preferably formed so that the n-type impurity concentration of the underlayer is $8\times10^{18}/cm^3$ or more, and the leakage current density is $1\times10^{-6}$ A/cm$^2$ or less. By this structure, when a reverse bias is applied, since the leakage current is suppressed, furthermore, an increase in power consumption is suppressed degradation of properties caused by crosstalk is prevented, and circuit malfunction can be prevented, so that stable and preferable operation properties can be maintained.

Furthermore, the structure is preferably formed so that the n-type impurity concentration of the underlayer is $1\times10^{19}/cm^3$ or more, and the leakage current density is $6\times10^{-7}$ A/cm$^2$ or less. By this structure, when a reverse bias is applied, since the leakage current is suppressed, furthermore, an increase in power consumption is suppressed, degradation of properties caused by crosstalk is prevented, and circuit malfunction can be prevented, so that stable and preferable operation properties can be maintained.

In addition, the structure is preferably formed so that the underlayer and the active layer are formed of a GaN-based compound containing In, and so that the In composition ratio of the GaN-based compound forming the underlayer is 0.005 or more and is smaller than that of the GaN-based semiconductor forming the active layer. By this structure, an effect of improving efficiency of a GaN-based semiconductor element and that of decreasing an operation voltage can be obtained.

In addition, the structure is preferably formed so that the underlayer is formed to have a thickness in the range of 5 nm to 5 µm. By this structure, an effect of decreasing an operation voltage can be obtained without degrading the crystalline quality.

In addition, the thickness of the underlayer is preferably set in the range of 20 nm to 1 µm. By this structure, a higher quality crystal can be realized, and an effect of further decreasing an operation voltage of a GaN-based semiconductor element can be obtained.

In addition, the second GaN-based compound layer preferably includes a GaN layer doped with a p-type impurity and having a thickness of 100 nm or more. By the structure described above, since the second GaN-based compound layer also functions as a surface protection layer for the GaN-based semiconductor element, a GaN-based semiconductor element having a small damage to the active layer and a small leakage current can be realized without increasing an operation voltage of the element.

In addition, the first GaN-based compound layer may be formed of GaN doped with Si which is an n-type dopant.

In addition, the element is preferably formed such that a p-type GaN layer including the second GaN-based compound layer and an n-type GaN layer including the first GaN-based compound layer and the underlayer are formed, an end surface of the element is inclined by an angle θ1 with respect to the primary surface of the p-type GaN layer or the n-type GaN layer, and a reflector is formed outside the end surface so as to face the end surface and to be inclined with respect to the primary surface described above by an angle θ2 which is smaller than θ1. By this structure, when the GaN-based semiconductor element is formed as a light-emitting element, a high light-extraction efficiency (light-emission efficiency) can be realized, and when the GaN-based semiconductor element is formed as a light-receiving element, a high light-absorption efficiency (light-receiving efficiency) can be realized.

In addition, the GaN-based semiconductor element is preferably formed as a light-emitting element. By this structure, when a reverse bias is applied, since the leakage current is suppressed, a light-emitting element can be realized which can suppress an increase in power consumption, prevent circuit malfunction, and maintain stable and preferable operation properties.

In addition, the GaN-based semiconductor element is preferably formed as a light-receiving element. By this structure, when operation is performed by applying a reverse bias, since the leakage current is suppressed, a light-receiving element can be realized which can prevent circuit malfunction and maintain stable and preferable operation properties.

In an optical device of an embodiment, the above GaN-based semiconductor element is formed as a light-emitting element or a light-receiving element; when the GaN-based semiconductor element is formed as a light-emitting element, light-emitting elements thus formed are disposed in a two-dimensional matrix to emit light, and when the GaN-based semiconductor element is formed as a light-receiving element, light-receiving elements thus formed are disposed in a two-dimensional matrix to receive light. By this structure, even in an optical device in which many GaN-based semiconductor elements are mounted, crosstalk can be suppressed, the light-emission efficiency (light-receiving efficiency) can be improved, so that stable and preferable operation properties can be maintained. By the way, instead of the two-dimensional matrix, of course, the GaN-based semiconductor elements may be disposed in one-dimensional matrix.

An image display apparatus of an embodiment is an image display apparatus using the optical device formed of the above GaN-based semiconductor elements as light-emitting elements or light-receiving elements; when the GaN-based semiconductor elements are formed as light-emitting elements, a pixel portion is formed of the above optical device, and an image formed by light emitted from the light-emitting elements disposed in a two-dimensional matrix is displayed. In addition, when the GaN-based semiconductor elements are formed as light-receiving elements, a first pixel portion is formed of the above optical device, the light-receiving elements disposed in a two-dimensional matrix in this first pixel portion receive light, an image formed based on the intensity of signals of light received by the light-receiving elements is displayed on a second pixel portion different from the first pixel portion. By the structure as described above, when a reverse bias is applied, since the leakage current is suppressed, degradation of properties caused by crosstalk can be prevented, and hence stable and preferable operation properties can be maintained.

In addition, the structure containing at least 100,000 GaN-based semiconductor elements is preferably formed. By this structure, in an image display apparatus which performs color display using GaN-based semiconductor elements emitting red color (R), blue color (B), and green color (G), which is an image display apparatus, such as QVGA (Quarter Video Graphic Array, pixel number: 320×420), SVGA (Super Quarter Video Graphic Array, pixel number: 800×600), or WVGA (Wide Quarter Video Graphic Array, pixel number: 800× 480), an increase in power consumption is suppressed, degradation of properties caused by crosstalk can be prevented, and circuit malfunction can be prevented, so that stable and preferable operation properties can be maintained.

In addition, the structure containing at least 1,000,000 GaN-based semiconductor elements is preferably formed. By this structure, in an image display apparatus, such as a full-specification hi-vision, which performs color display using GaN-based semiconductor elements emitting red color (R), blue color (B), and green color (G), an increase in power consumption is suppressed, degradation of properties caused by crosstalk can be prevented, and circuit malfunction can be prevented; hence, an image display apparatus which can maintain stable and preferable operation properties can be realized.

A GaN-based compound semiconductor element (hereinafter referred to as "GaN-based semiconductor element") of an embodiment has a first GaN-based compound layer including an n-type conductive layer; a second GaN-based compound layer including a p-type conductive layer; and an active layer, which emits or receives light, provided between the first GaN-based compound layer and the second GaN-based compound layer, and the first GaN-based compound layer includes an underlayer of a GaN-based semiconductor having an n-type impurity concentration in the range of $3 \times 10^{18}$ to $3 \times 10^{19}/cm^3$.

The GaN-based semiconductor element is formed as a light-emitting element in which the active layer emits light or as a light-receiving element in which the active layer receives light. When a reverse bias of 5 V is applied to the GaN-based semiconductor element, a leakage current density, which is the density of a current flowing per unit area of the active layer, is $2 \times 10^{-5}$ A/cm$^2$ or less.

A plurality of the above GaN-based semiconductor elements are disposed in a two-dimensional matrix to form an optical device, first electrodes of the GaN-based semiconductor elements disposed along lines in a first direction are connected to common wires of the respective lines in the first direction, and second electrodes of the GaN-based semiconductor elements disposed along lines in a second direction are connected to common wires of the respective lines in the second direction.

A plurality of GaN-based semiconductor elements are each formed as a light-emitting element, and in an image display apparatus having a pixel portion formed of the above optical device, the GaN-based semiconductor elements are passive matrix driven. A plurality of GaN-based semiconductor elements are each formed as a light-receiving element, and in a two-dimensional light-receiving apparatus having a light-receiving portion formed of the above optical device, the GaN-based semiconductor elements are passive matrix driven.

In a light-emitting element having a pn structure of a GaN-based compound semiconductor, when a reverse bias is applied, a current may be generated in some cases. When a GaN-based compound semiconductor is formed as a light-emitting element, a leakage current generated when a reverse bias is applied causes an increase in power consumption and circuit malfunction, and in a device in which light-emitting elements are connected and controlled, crosstalk may be generated thereby. In addition, when a GaN-based compound semiconductor is formed as a light-receiving element, a dark current generated when a reverse bias is applied causes degradation of an S/N ratio of a photodetector (light receiver).

Hereinafter, the case will be described in which a GaN-based compound semiconductor is formed as a light-emitting element, and a current generated when a reverse bias is applied is a leakage current. In the case in which a GaN-based compound semiconductor is formed as a light-receiving element, and a current generated when a reverse bias is applied is a dark current, in the following description, light-emitting may be changed to light-receiving, and the leakage current may be changed to the dark current.

It is believed that the leakage current is generated due to the presence of dislocations and/or defects. In the present invention, it was confirmed by the actual measurement that when a doping concentration of an element doped in an underlayer which is composed of a GaN-based compound semiconductor and which forms the first GaN-based compound layer is controlled, the leakage current generated during reverse bias application can be significantly decreased even under the presence of dislocations and/or defects.

As disclosed in a general physics textbook, a high concentration doping in the vicinity of a PN junction increases a junction electric field at the PN junction. As a primary reason for device degradation, electromigration is mentioned, and it is estimated that a large junction electric field causes electric-field migration and generates a leakage current.

However, according to an embodiment, results against the above estimation were confirmed by the actual measurement. In addition, although it is also estimated that when an n-type impurity itself diffuses, a high doping concentration in the vicinity of an interface of the PN junction may function as a leakage current source, a significantly decreased leakage current was actually obtained as the measurement result.

In an embodiment, in a gallium nitride-based light-emitting element having a p-type layer and an n-type layer, a doping concentration in an n-type underlayer is set in the range of $3 \times 10^{18}$ to $9 \times 10^{19}/cm^3$, that is, a doping amount is increased in a layer which generally has a low doping concentration. By the structure as described above, the leakage current density (density of a leakage current flowing per unit area of an active layer) generated when a reverse bias of 5 V is applied can be decreased to $2 \times 10^{-5}$ A/cm$^2$ or less. More preferably, when the doping concentration of the n-type underlayer is set to $4 \times 10^{18}/cm^3$ or more, $8 \times 10^{18}/cm^3$ or more, or $1 \times 10^{19}/cm^3$ or more, the leakage current density can be decreased to $8 \times 10^{-6}$ A/cm$^2$ or less, $1 \times 10^{-6}$ A/cm$^2$ or less, or $6 \times 10^{-7}$ A/cm$^2$ or less, respectively.

By the structure as described above, since the generation of leakage current which occurs when a reverse bias is applied can be suppressed, in an apparatus, such as an image display apparatus, in which many light-emitting elements are connected and controlled, a leakage current, which has seriously adverse influences, can be suppressed, crosstalk can be suppressed, and as a result, stable and preferable operation properties can be maintained.

Hereinafter, with reference to the drawings, embodiments will be described in detail.

Embodiments

FIG. 1 is a graph showing the relationship between a Si doping concentration of an underlayer and a leakage current density of a GaN-based semiconductor light-emitting element of an embodiment.

In FIG. 1, the horizontal axis indicates the Si concentration doped in the underlayer per unit volume thereof, and the vertical axis indicates the leakage current density (leakage current flowing per unit area of an active layer) obtained when a reverse bias (5 V) is applied.

The GaN-based semiconductor element of the embodiment has a first GaN-based compound layer including an n-type conductive layer; a second GaN-based compound layer including a p-type conductive layer; and an active layer which is provided between the first GaN-based compound layer and the second GaN-based compound layer, and which emits light, and the first GaN-based compound layer includes an underlayer doped with Si which is an n-type impurity. Layers forming the first GaN-based compound layer and those forming the second GaN-based compound layer will be described in detail with reference to FIG. 2.

As apparent from the results shown in FIG. 1, the leakage current density is changed with the Si concentration doped in the underlayer, and hence by changing the Si doping concentration, the leakage current density can be controlled.

When the Si doping concentration of the underlayer is set to $2\times10^{18}/cm^3$ or more, the leakage current density can be decreased to approximately $1\times10^{-4}$ A/cm$^2$ or less.

When the Si doping concentration of the underlayer is set to $3\times10^{18}/cm^3$ or more, the leakage current density can be decreased to approximately $2\times10^{-5}$ A/cm$^2$ or less.

When the Si doping concentration of the underlayer is set to $4\times10^{18}/cm^3$ or more, the leakage current density can be decreased to approximately $8\times10^{-6}$ A/cm$^2$ or less.

When the Si doping concentration of the underlayer is set to $5\times10^{18}/cm^3$ or more, the leakage current density can be decreased to approximately $3\times10^{-6}$ A/cm$^2$ or less.

When the Si doping concentration of the underlayer is set to $8\times10^{18}/cm^3$ or more, the leakage current density can be decreased to approximately $1\times10^{-6}$ A/cm$^2$ or less.

When the Si doping concentration of the underlayer is set to $1\times10^{19}/cm^3$ or more, the leakage current density can be decreased to approximately $6\times10^{-7}$ A/cm$^2$ or less.

When the Si doping concentration of the underlayer is set to $1.3\times10^{19}/cm^3$ or more, the leakage current density can be decreased to approximately $3\times10^{-7}$ A/cm$^2$ or less.

When the Si doping concentration of the underlayer is set to $2\times10^{19}/cm^3$ or more, the leakage current density can be decreased to approximately $1\times10^{-7}$ A/cm$^2$ or less.

When the Si doping concentration of the underlayer is set to $3\times10^{19}/cm^3$ or more, the leakage current density can be decreased to approximately $4\times10^{-8}$ A/cm$^2$ or less.

In the case of a monochrome image display apparatus used as a simple display in which 160×120 (QQVGA (Quarter Quarter Video Graphic Array) light-emitting elements are simple matrix wired, for example, when a drive current density is set in the range of 10 to 100 A/cm$^2$, the leakage current density per one element during reverse bias application is ((10 to 100) A/cm$^2$/18,921, that is, approximately (0.5 to 5) mA/cm$^2$. When the leakage current density per one light-emitting element during reverse bias application is more than this value, that is, more than approximately (0.5 to 5) mA/cm$^2$, the supplied current is all consumed as the leakage current, and hence, desired light emission may not be easily performed.

Accordingly, in order to perform desired light emission per one light-emitting element, it is necessary to decrease the leakage current density to approximately one twenty-thousandth or less of the drive current density, and the leakage current density is necessarily decreased to approximately (0.5 to 5) mA/cm$^2$ or less.

Figure 2:
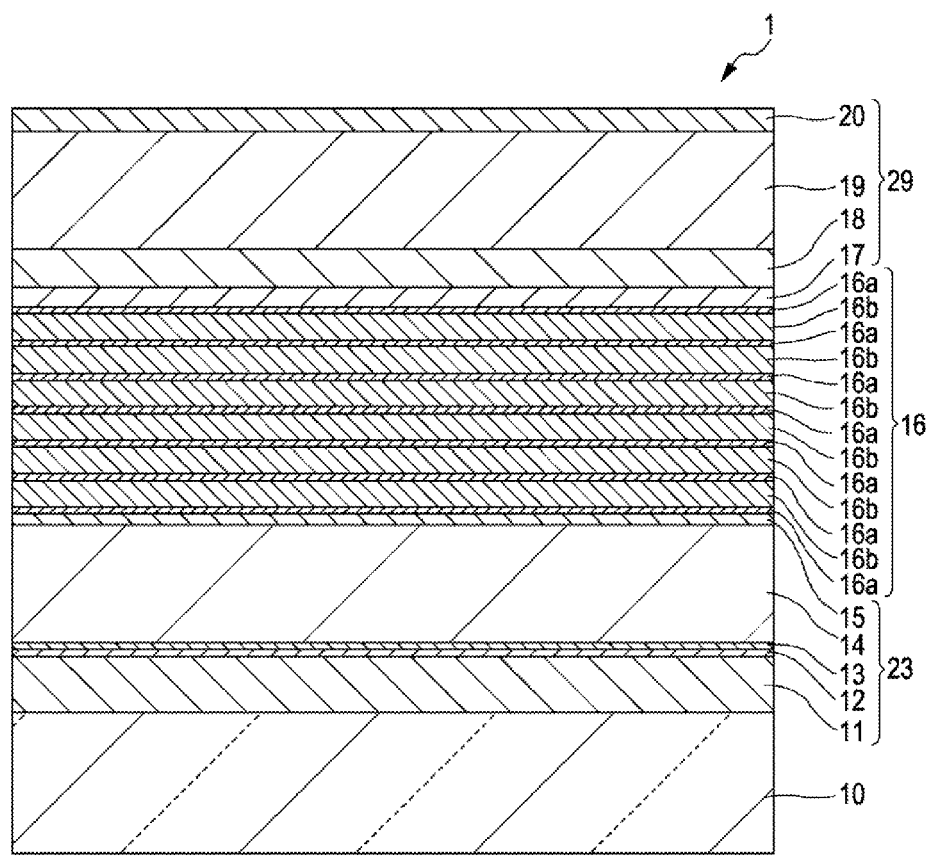
FIG. 2 is a view illustrating a layer structure of a GaN-based semiconductor light-emitting element according to an embodiment.

In this case, in order to obtain a leakage current density of approximately (0.5 to 5) mA/cm$^2$ or less per one light-emitting element during reverse bias application, the Si doping concentration of an underlayer 14 shown in FIG. 2 is necessarily set to $3\times10^{18}/cm^3$ or more.

In addition, when a ratio of 1:500 or more is necessary as a contrast ratio, the leakage current density is necessarily decreased to approximately one ten-millionth ($10^{-7}$) or less of the drive current density, that is, is necessarily decreased to approximately (1 to 10) μA/cm$^2$ or less.

In this case, in order to obtain a leakage current density of (1 to 10) μA/cm$^2$ or less per one light-emitting element during reverse bias application, the Si doping concentration of the underlayer 14 shown in FIG. 2 is necessarily set to ($8\times10^{18}/cm^3$ to $3\times10^{18}/cm^3$) or more, and when the Si doping concentration is set to $3\times10^{18}/cm^3$ or more, the leakage current density can be reliably decreased to 1 μA/cm$^2$ or less, so that the leakage current density can be effectively decreased during reverse bias application.

In addition, when the Si doping concentration of the underlayer is $3\times10^{19}/cm^3$ or less, a flat film having a thickness of approximately 1 μm can be stably grown. In addition, when the Si doping concentration of the underlayer is $2\times10^{19}/cm^3$ or less, a flat film can be stably grown regardless of the film thickness thereof.

As described above, at a drive current density of 10 to 100 A/cm$^2$, when the Si doping concentration of the underlayer is set to $3\times10^{18}/cm^3$ or more, the leakage current density can be decreased to one twenty-thousandth or less of the drive current density, and when the Si doping concentration of the underlayer is set to ($8\times10^{18}$ to $3\times10^{18}/cm^3$) or more, the leakage current density can be decreased to one ten-millionth or less of the drive current density.

Accordingly, in a GaN-based semiconductor element having a pn structure, the leakage current density generated during reverse bias application can be suppressed; hence, even in an optical device in which GaN-based semiconductor elements are mounted, crosstalk can be suppressed, the light-emission efficiency or the light-receiving efficiency can be improved, an image display apparatus using an optical device in which GaN-based semiconductor elements are mounted can be realized, and stable and preferable operation properties can be maintained.

FIG. 2 is a schematic cross-sectional view illustrating a layer structure of a GaN-based semiconductor light-emitting element of an embodiment.

As shown in FIG. 2, a GaN-based light-emitting element 1 has a first GaN-based compound layer 23 including an n-type conductive layer, an active layer 16, and a second GaN-based compound layer 29 including a p-type conductive layer, and the first GaN-based compound layer 23 includes the underlayer 14 of a GaN-based compound semiconductor.

The first GaN-based compound layer 23 is formed of a buffer layer (also called a LT-GaN layer, a low-temperature deposition GaN buffer layer, or a low-temperature buffer layer) 11 having a thickness of 30 nm, an undoped GaN layer 12 having a thickness of 1 μm, an n-type conductive first GaN-based compound semiconductor layer (GaN: Si layer) 13 having a Si doping concentration of $5\times10^{18}/cm^3$ and a thickness of 3 μm, an underlayer (In$_{0.03}$Ga$_{0.97}$N: Si layer) 14 having a Si doping concentration as shown in FIG. 1 and a thickness of 150 nm, and a lower spacer layer (undoped GaN layer) 15 having a thickness of 5 nm, those layers being provided on a substrate (sapphire substrate) 10 in that order.

The active layer (InGaN/GaN multi-quantum well layer) 16 having a thickness of 111 nm is formed above the underlayer 14 and includes alternately laminated well layers (In$_{0.23}$Ga$_{0.77}$N layer) 16a having a thickness of 3 nm and barrier layers (GaN layer) 16b having a thickness of 15 nm. In an example shown in FIG. 2, the active layer 16 includes 7 well layers 16a and 6 barrier layers 16b. The second GaN-based compound layer 29 is formed on the active layer 16. In this structure, the In composition ratio (0.23) of the active layer 16 is higher than the In composition ratio (0.03) of the underlayer 14.

The second GaN-based compound layer 29 is formed of an upper spacer layer (undoped GaN layer) 17 having a thickness of 10 nm, an AlGaN layer ($Al_{0.15}Ga_{0.85}N$: Mg layer) 18 having an Mg doping concentration of $5 \times 10^{19}/cm^3$ and a thickness of 20 nm, a p-type conductive second GaN-based compound semiconductor layer (GaN: Mg layer) having an Mg doping concentration of $5 \times 10^{19}/cm^3$ and a thickness of 100 nm, and a contact layer ($In_{0.15}Ga_{0.85}N$: Mg layer) 20 having an Mg doping concentration of $1 \times 10^{20}/cm^3$ and a thickness of 5 nm, those layers being provided in that order on the active layer 16.

In this embodiment, since the underlayer 14 is formed between the first GaN-based compound semiconductor layer 13 and the active layer 16, the crystallinity of the active layer 16 which is formed on or above the underlayer 14 can be improved, and as a result, improvement in properties, such as a significant decrease in operation voltage, of the GaN-based light-emitting element 1 can be achieved.

In addition, the layers forming the first GaN-based compound layer 23 and the layers forming the second GaN-based compound layer 29 are all transparent to emission light wavelengths. Hereinafter, the individual layers shown in FIG. 2 will be described.

Sapphire Substrate 10:

The sapphire substrate 10 is a substrate which grows a crystal thereon, and since having a C-plane orientation of the corundum structure, the sapphire substrate 10 determines the orientation of a gallium nitride crystal grown thereon. By using an intentionally inclined C plane, the crystalline quality and/or the device properties of a gallium nitride-based compound semiconductor element formed on the sapphire substrate 10 can be improved. Since the sapphire substrate 10 is a transparent substrate in a wavelength region from ultraviolet to infrared, a high light-extraction efficiency is obtained without absorbing light emitted from a light-emitting element, and as a result, improvement in light-emission efficiency can be achieved. Furthermore, since being a very hard and stable material, sapphire can withstand a high temperature (700 to 1,400° C.) during crystal growth of a gallium nitride-based compound semiconductor and can also withstand corrosive gases such as ammonia. In addition, as a substrate used for forming the gallium nitride-based semiconductor element of the embodiment, other substrates, such as silicon carbide, silicon, glass, quartz, zinc oxide, zirconium diboride, gallium arsenide, gallium phosphide, $LiAlO_2$, gallium nitride, and aluminum nitride, may also be used. In addition, after the crystal growth, the substrate may be peeled off.

As for the plane orientation, many examples other than the C plane have also been reported, and in particular, researches on R-plane sapphire and M-plane sapphire for growing nonpolar GaN have been carried out in recent years; however, the advantage of the C-plane crystal growth is that by using a low-temperature buffer technique described below, a high quality crystal can be easily obtained. It has also been reported that by using a substrate having an inclined C plane, a crystal having a higher quality is obtained, and by a substrate inclined by 0.2 to 1°, the crystalline quality and the light-emission efficiency of an InGaN layer can be improved. As the case as described above, substrates having various plane orientations have been investigated using various materials, and substrates having an A plane, an R plane, and an M plane besides the C plane of a hexagonal structure (including the corundum structure/wurtzite structure), a (111) plane and a (001) plane of a cubic structure (including the diamond structure/zinc blende structure), and intentionally inclined (for example, 0 to 10°) planes thereof may also be used.

Low-Temperature Buffer Layer (LT-GaN Layer) 11:

The effect of this low-temperature buffer layer 11 has been explained in some cases such that an amorphous-like crystal reduces strain caused by lattice mismatch; however, according to a recent research result, it has been believed that a function of forming crystalline nuclei for $C^+$-plane growth (Ga surface growth) of GaN on a sapphire substrate is more important. It has been known that when GaN is directly grown on a sapphire C-plane substrate at a high temperature (approximately 1,000° C.), $C^-$-plane growth (N surface growth) occurs. As a layer formed between the substrate and a crystal formed thereon, besides a low-temperature buffer layer, a layer composed of aluminum nitride, a mixed crystal thereof, a metal film, or a material partly including a selective grown film of a growth inhibition material may be used, and in addition, a material grown on the substrate at a low temperature (approximately 500° C.) or a high temperature (more than 1,000° C.) may also be used.

Undoped GaN layer 12:

When a film formed as the low-temperature buffer layer 11 is processed by increasing the temperature to approximately 1,000° C., which is a general growth temperature of GaN, while ammonia, which is a raw material, and a carrier gas, such as hydrogen or nitrogen, are made to flow, because of evaporation or transfer of atoms on surfaces, isolated grain-shaped crystalline nuclei are formed. Crystals having a size of approximately 10 to 100 nm surrounded by crystalline surfaces called facets are generally formed. In general, the growth starts from the crystal nuclei, for example, when trimethylgallium is supplied as a Ga raw material, and during this period, growth in a lateral direction (also in a direction perpendicular thereto depending on conditions) occurs from each crystal nucleus so as to propagate crystalline defects called dislocations in the lateral direction; as a result, the number of dislocations which propagate vertically in a film formed thereafter can be decreased. From three-dimensional growth in an island shape to two-dimensional growth via pseudo two-dimensional growth, crystals grown from the nuclei are united together, and as a result, a flat film is finally formed. In this embodiment, although the undoped GaN layer 12 is formed, Si or the like may be doped therein. The growth patterns, such as the crystal nuclei formation, the three-dimensional growth, and the two-dimensional growth, are not limited to those described above, and depending on growth conditions of crystals and on types of substrates and buffer layers, various patterns may be carried out.

First GaN-Based Compound Semiconductor Layer (GaN: Si Layer) 13:

Si is doped to obtain n-type conductivity. In order to form a flat film for this layer following the above two-dimensional growth, growth is preferably carried out to obtain a thickness of 2 μm or more including the undoped GaN layer 12. The first GaN-based compound semiconductor layer 13 has functions to form a contact with an n-type electrode, to uniformly spread current in an n-type layer, and to form a pn junction of LED. In accordance with the above individual functions, the doping concentration may be intentionally modulated in this layer, a layer, such as AlGaN/InGaN, may be included, and/or the thickness may be adjusted.

Underlayer ($In_{0.03}Ga_{0.97}N$: Si Layer) 14:

The underlayer 14 includes In, the In composition is 0.5% or more and is preferably lower than the In composition of the well layer 16a of the active layer 16, and in this In composition range, effects generated by the addition of In, that is, effects of increasing a light-emission efficiency and of decreasing an operation voltage, can be obtained. When the In composition is more than that of the well layer of the active layer, light emission of the active layer is absorbed, and when the In composition is less than 0.5%, the effects generated by the addition of In described above are degraded.

When the thickness of the underlayer is less than 5 nm, the voltage decreasing effect may not be easily obtained, and when the thickness is more than 5 μm, due to accumulation of lattice strain between GaN and InGaN, the crystalline quality is degraded. That is, when the thickness of the underlayer is in the range of 5 nm to 5 μm, without degrading the crystalline quality, the effects generated by the addition of In can be obtained. In order to realize a further decrease in voltage and a further improvement in crystalline quality, the thickness of the underlayer is preferably 20 nm or more and more preferably 50 nm or more, and as the upper limit, a thickness of 1 μm may be mentioned by way of example.

Lower Spacer Layer (Undoped GaN Layer) 15:

The lower spacer layer 15 is formed between the active layer 16 and the underlayer 14. The lower spacer layer 15 is provided to further improve the crystallinity of the active layer 16 to be crystal-grown thereon and to decrease the operation voltage. The thickness (in other words, the distance between the underlayer 14 and the active layer 16) of the lower spacer layer 15 is 50 nm or less and is preferably 20 nm or less in order to realize a low operation voltage.

Active Layer (InGaN/GaN Multi-Quantum Well Layer) 16, Well Layer ($In_{0.23}Ga_{0.77}N$ Layer) 16a, Barrier Layer (GaN Layer) 16b:

The active layer 16 is a multi-quantum well active layer including well layers 16a of InGaN having a low bandgap energy and the barrier layers 16b of GaN having a wide bandgap energy. After electrons from the n-type semiconductor layer and holes from the p-type semiconductor layer are injected and are distributed in the well layers 16a having a low bandgap energy, recombination between the electrons and the holes occurs, so that light is emitted. Although the emission light wavelength is changed in accordance with the lattice strain and the thickness of the well layer 16a, in an InGaN/GaN quantum well formed on the C plane, a large piezoelectric field is generated which is caused by the lattice strain and polarity thereof. Accordingly, since the light-emission efficiency is remarkably degraded in a thick well layer, an optimum well layer 16a which realizes ultraviolet to yellow light emission has a thickness of approximately 3 nm. In the well layer 16a having a thickness of approximately 3 nm, the In composition is approximately 7% for ultraviolet light emission, is approximately 15% for blue light emission, and is approximately 23% for green light emission. In order to adjust the properties, such as wavelength and/or efficiency, a mixed crystal including aluminum nitride may also be formed.

Upper Space Layer (Undoped GaN Layer) 17:

The upper space layer 17 is formed between the active layer 16 and an AlGaN: Mg layer 18. This upper space layer 17 is formed to have a thickness of 100 nm or less and preferably 20 nm or less. The upper spacer layer 17 is formed to prevent dopant Mg in the AlGaN: Mg layer 18 from being diffused into the active layer 16; hence, the diffusion of Mg into the active layer 16 is suppressed, and effects of improving light-emission efficiency and reliability can be obtained.

AlGaN Layer ($Al_{0.15}Ga_{0.85}N$: Mg Layer) 18:

The AlGaN layer 18 is a p-type layer located in the vicinity of the active layer (multi-quantum well layer) 16, and since being formed of AlGaN having a higher bandgap energy than that of the GaN layer which is the barrier layer 16b of the active layer 16, the AlGaN layer 18 functions as an electron barrier to block overflow or transmission of electrons injected into the active layer 16 from the n-type layer to the p-type layer. In addition, the AlGaN layer 18 has a function as a hole supply layer for directly supplying holes to the active layer 16, and since AlGaN, which is more stable at a high temperature, is disposed in the vicinity of the active layer 16, it also has a function as a protection layer against heat, hydrogen gas, and the like. This layer may also be formed of a mixed crystal containing indium nitride, and besides a layer formed of a single composition, the layer may be formed so that the composition thereof is continuously or periodically changed. For example, by a superlattice structure in which $Al_{0.15}Ga_{0.85}N$ (layer thickness: 1.6 nm) and GaN (layer thickness: 2.4 nm) are periodically formed five times, a further improvement in output and/or a further decrease in voltage can be realized.

Second GaN-Based Compound Semiconductor Layer (GaN: Mg Layer) 19:

The second GaN-based compound semiconductor layer 19 has, as a p-type conductive layer, a function of hole transfer from a p-side electrode to the active layer 16 and a function of hole diffusion in a lateral direction, and when being formed above the active layer 16 to have an appropriate thickness in the range of, as the total p-type layer, 100 nm to 1 μm, the second GaN-based compound semiconductor layer 19 also functions as a surface protection layer. When the thickness of the second GaN-based compound semiconductor layer 19 is excessively small, influences of surface damage and the like reach the active layer 16 and degrade the properties thereof, and as a result, a leakage current may be generated. When the thickness of the second GaN-based compound semiconductor layer 19 is excessively large, since the mobility of holes and the carrier concentration in the p-type GaN are generally low, the operation voltage is unfavorably increased. When the thickness of the second GaN-based compound semiconductor layer 19 is set in the range of 100 nm to 1 μm, without increasing the operation voltage, damage done to the active layer 16 is reduced, and an element having a small leakage current can be realized.

In addition, the second GaN-based compound semiconductor layer 19 may function as a contact layer in direct contact with a metal in some cases. A preferable doping concentration is in the range of approximately $1 \times 10^{19}$ to $2 \times 10^{20}/cm^3$, and outside the range described above, a stable p-type layer is difficult to obtain, so that an increase in operation voltage and/or a decrease in light-emission efficiency are liable to occur. In addition, when the structure is formed in which approximately 20 nm thickness of a contact interface only has a high doping concentration in the range of $2 \times 10^{20}$ to $4 \times 10^{20}/cm^3$, a contact resistance can also be decreased.

Contact Layer ($In_{0.15}Ga_{0.85}N$: Mg Layer) 20:

Since the contact layer 20 is formed using InGaN having a bandgap energy lower than that of GaN, an effect of easily forming a p-type layer by decreasing the activation energy of doped Mg, an effect of decreasing a contact resistance with the p-side electrode by forming a high concentration hole gas in InGaN using the band offset of GaN/InGaN, and an effect of further decreasing the contact resistance using a piezoelectric field at InGaN/GaN can be obtained. In order to decrease the contact resistance, the In composition is set in the range of approximately 5% to 25%, the thickness is set in the range of approximately 1 to 100 nm, and the Mg concentration is in the range of approximately 0 (undoped) to $4 \times 10^{20}/cm^3$.

When the thickness is less than 1 nm, the effect of decreasing a drive voltage is not significant, and when the thickness is more than 100 nm, due to relaxation of crystal lattice, the crystallinity is degraded. In addition, when the In composition is less than 5%, the effect of decreasing a drive voltage is not significant, and when the In composition is more than 25%, due to relaxation of crystal lattice, the crystallinity is degraded. In addition, when the doping concentration is more than $4\times10^{20}/cm^3$, the crystallinity is degraded. In addition, the reason the Mg doping concentration may be set to 0% (undoped) is that when a GaN layer in contact with the contact layer 20 is doped with Mg, holes from the Mg are supplied to the InGaN layer, which is the contact layer 20, and holes at a high concentration are generated. In addition, the contact layer 20 may not be always necessary. Besides a layer formed of a single composition, this layer may also be formed so that the composition thereof is continuously or periodically changed.

Figure 3A:
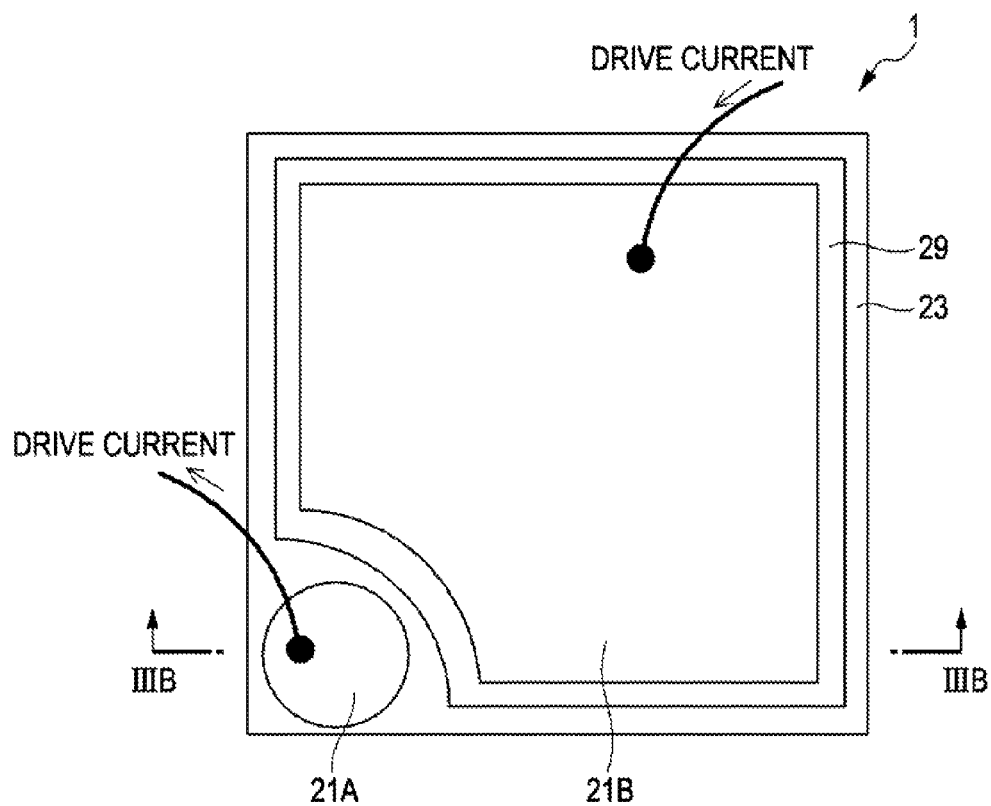
FIGS. 3A and 3B are views each illustrating a structure of a GaN-based semiconductor light-emitting element according to an embodiment.
Figure 3B:
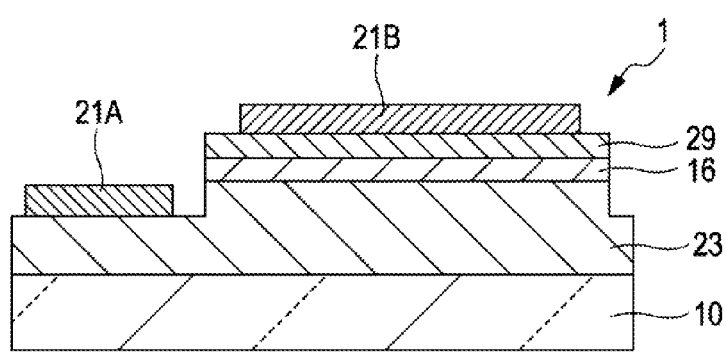

FIGS. 3A and 3B are schematic views each illustrating the structure of the GaN-based semiconductor light-emitting element of the embodiment. FIG. 3A is a schematic view of the GaN-based light-emitting element 1 when viewed from above, and FIG. 3B is a schematic cross-sectional view taken along line IIIB-IIIB of FIG. 3A.

As shown in FIGS. 3A and 3B, a p-side electrode 21B is formed on the contact layer 20 of the second GaN-based compound layer 29, and an n-type electrode 21A is formed on a part of the first GaN-based compound semiconductor layer 13 which is exposed by partly removing the first GaN-based compound layer 23, so that a drive current can be made to flow.

In the GaN-based light-emitting element 1 of this embodiment, the area of the active layer (area of a junction region) is set to $6\times10^{-4}$ cm$^2$. Hence, the drive current density of the GaN-based light-emitting element 1 is a value obtained by dividing a drive current value by $6\times10^{-4}$ cm$^2$ which is the area of the active layer.

As the GaN-based light-emitting element 1 of this embodiment, a light-emitting diode (LED) or a semiconductor laser (LD) may be mentioned by way of example, and the GaN-based light-emitting element 1 may be applied to a light-emitting device formed of GaN-based light-emitting elements and color conversion materials, an image display apparatus of a direct-viewing type, a projection type, or the like, and a planar light source device (backlight). In addition, the GaN-based light-emitting element 1 may also be applied to various devices used for lighting, natural illumination, display, and the like.

The GaN-based light-emitting element 1 may be formed to have a face-up structure or a flip-chip structure.

Next, the case will be described in which the cross-section of the GaN-based light-emitting element is formed to have a trapezoid shape in order to improve the efficiency.

A GaN-based light-emitting element having a trapezoidal cross-sectional shape may be formed such that an end surface thereof is inclined by an angle $\theta_1$ with respect to the primary surface of the first GaN-based compound layer 23 or the second GaN-based compound layer 29, and such that a reflector is formed outside the end surface to be faced thereto and to be inclined by an angle $\theta_2$, smaller than the angle $\theta_1$, with respect to the above primary surface. That is, a diode structure of the GaN-based light-emitting element is formed of a semiconductor layer including the first GaN-based compound layer 23, the second GaN-based compound layer 29, and the active layer 16, and as the primary surface of this semiconductor layer, the primary surface of the first GaN-based compound layer 23 or the second GaN-based compound layer 29 is selected, and the end surface of this semiconductor layer is inclined by the angle $\theta_1$ with respect to the primary surface of the semiconductor layer.

The planar shape of this semiconductor layer is, for example, circular, square, or rectangular, and whenever necessary, may be another shape obtained, for example, by regularly or irregularly changing an entire or a part of a circle, such as an oval shape. Furthermore, the planar shape may be a polygonal shape having n corners (n is an integer of 3 or more) or a shape obtained by regularly or irregularly changing an entire or a part of the above polygonal shape having n corners.

The cross-sectional shape of this semiconductor layer is, for example, a trapezoid shape or an inverted trapezoid shape and may also be a modified shape thereof. In addition, the inclined angle $\theta_1$ of this semiconductor layer is typically constant; however, the inclined angle may not be always necessary to be constant and may be changed in the end surface.

In order to improve the light-extraction efficiency, a transparent resin layer having a refractive index (larger than that of air) smaller than the refractive index of the semiconductor layer is preferably formed between the reflector and the end surface of the semiconductor layer. For the transparent resin layer, various types of resins may be used, and in accordance with necessity, a suitable resin material is to be selected. As in the case described above, preferably, the thickness of the semiconductor layer is set in the range of 0.3 to 10 µm, and the ratio of the thickness of this semiconductor layer to the maximum diameter thereof is set in the range of 0.001 to 2.

Although the maximum diameter of the semiconductor layer may be determined in accordance with necessity, it is generally 50 µm or less, typically 30 µm or less, and more typically 25 µm or less. In addition, when the semiconductor layer has a first electrode and a second electrode on a light-extraction surface and a surface opposite thereto, respectively, the reflector is formed in ohmic contact with the second electrode so as to be used as a part of the second electrode or a part of a wire connected thereto.

In addition, when $30°\leq\theta_1\leq90°$ C. holds, the reflector is formed so as to at least include an area of an inclined surface of the transparent resin layer, the area being formed by projecting the end surface in a direction perpendicular thereto on the inclined surface of the transparent resin layer. In a manner similar to that described above, when $90°\leq\theta_1\leq150°$ C. holds, the reflector is formed so as to at least include an area of the inclined surface of the transparent resin layer, the area being formed by projecting the end surface on the inclined surface of the transparent resin layer through a first path in a direction perpendicular to the end surface and a second path toward the inclined surface of the transparent resin layer after the first path is reflected on the bottom surface of the first GaN-based compound layer 23.

In addition, the reflector is preferably formed to extend on a surface located opposite to the light-extraction surface of the semiconductor layer. In addition, in the range of $30°\leq\theta_1\leq150°$, when $30°\leq\theta_1\leq90°$ holds, it is set that $\theta_2\geq(\theta_1-\sin^{-1}(n_3/n_2))/2$ and $\theta_2\leq\theta_1/2$ hold, and when $90°\leq\theta_1\leq150°$ holds, it is set that $\theta_2\geq((\theta_1-90)-\sin^{-1}(n_3/n_2))/2$ and $\theta_2\leq(\theta_1-90)/2$, in which $n_2$ indicates the refractive index of the transparent resin layer, and $n_3$ indicates the refractive index of a medium (such as air) outside the transparent resin layer.

Besides the case in which the reflection surface of the reflector facing the end surface of the semiconductor layer is flat, the reflection surface may have a curved portion in some cases. In addition, it is preferable that the semiconductor layer have the first electrode and the second electrode on the light-extraction surface and the surface opposite thereto, respectively, and that this first electrode be provided in a region other than that to which the end surface is projected to the light-extraction surface of the semiconductor layer in a direction perpendicular thereto.

According to the GaN-based light-emitting element having a trapezoidal cross-sectional shape, the light-extraction efficiency can be significantly improved, the light-emission efficiency can be significantly improved, and further a light-emitting diode which is easily miniaturized can be obtained. In addition, by using this miniaturized light-emitting diode having a high light-emission efficiency, for example, a high-quality light-emitting diode backlight, light-emitting diode lighting device, a light-emitting diode display, and electronic apparatuses can be realized.

Figure 4:
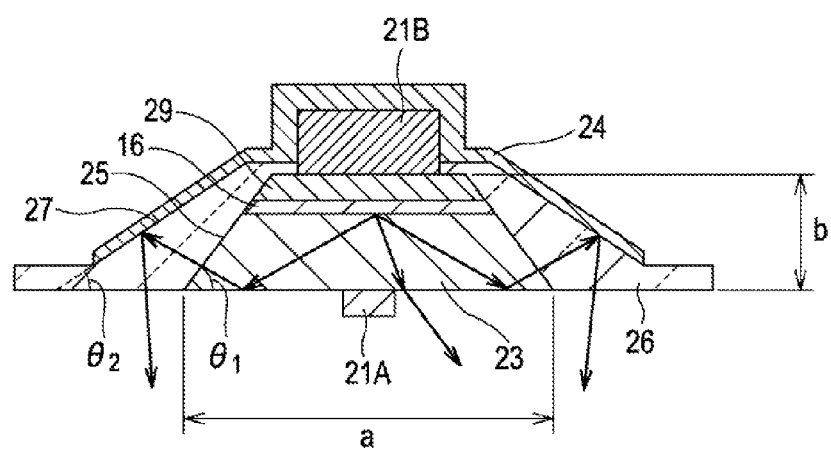
FIG. 4 is a view illustrating the structure of a GaN-based semiconductor light-emitting element ($\theta_1<90°$), according to an embodiment.

FIG. 4 is a cross-sectional view illustrating the structure of a GaN-based semiconductor light-emitting element (hereinafter referred to as "GaN-based light-emitting element" in some cases) ($\theta_1 < 90°$) of the embodiment.

As shown in FIG. 4, the GaN-based light-emitting element ($\theta_1 < 90°$) is formed of the first GaN-based compound layer 23, the active layer 16 provided thereon, and the second GaN-based compound layer 29 provided on the active layer 16. The first GaN-based compound layer 23, the active layer 16, and the second GaN-based compound layer 29 have, for example, a circular plan shape as a whole, and an end surface (side surface) 25 is inclined by an angle $\theta_1$ with respect to the bottom surface of the first GaN-based compound layer 23. A cross-sectional shape in a diameter direction of the first GaN-based compound layer 23, the active layer 16, and the second GaN-based compound layer 29 is a trapezoid shape ($\theta_1 < 90°$), and on the second GaN-based compound layer 29, for example, the circular p-side electrode 21B is formed. A transparent resin layer 26 is formed so as to cover the end surface 25 and the upper surface of the second GaN-based compound layer 29 at the periphery of the p-side electrode 21B. In addition, a reflection film 24 is formed so as to entirely cover the transparent resin layer 26 and the p-side electrode 21B. On the bottom surface of the first GaN-based compound layer 23, for example, the circular n-type electrode 21A is formed.

In this GaN-based light-emitting element ($\theta_1 < 90°$), in order to maximize the light-extraction efficiency, the following structure is optimized.

(1) An inclined surface 27 of the transparent resin layer 26 is inclined by an angle $\theta_2$ with respect to the bottom surface of the first GaN-based compound layer 23, and hence the reflection film 24 is also inclined by an angle $\theta_2$ with respect to the bottom surface of the first GaN-based compound layer 23. In this case, $\theta_2 < \theta_1$ holds. Accordingly, since light generated from the active layer 16 and emitted from the end surface 25 is reflected by this reflection film 24 and goes downward, the light can be easily extracted outside.

(2) When the entire refractive index of the first GaN-based compound layer 23, the active layer 16, and the second GaN-based compound layer 29 is represented by $n_1$, the refractive index $n_2$ of the transparent resin layer 26 satisfies the equation: refractive index of air < $n_2$ < $n_1$. Accordingly, compared to the case in which the medium outside the end surface 25 is air, the light generated from the active layer 16 and incident on the end surface 25 is likely to be emitted outside from the end surface 25 and is finally likely to be extracted outside.

(3) When the maximum diameter of the GaN-based light-emitting element ($\theta_1 < 90°$), that is, the diameter of the bottom surface of the first GaN-based compound layer 23, is represented by a, and the total thickness (height) is represented by b, the aspect ratio b/a is in the range of 0.001 to 2, and b is in the range of 0.3 to 10 μm.

(4) As a material for the reflection film 24, a material having a higher reflectance to light of a light emission wavelength, such as a metal primarily composed of Au or Ag, is used. Accordingly, light emitted outside from the end surface 25 and the top surface of the second GaN-based compound layer 29 can be efficiency reflected by this reflection film 24 and, finally, can be likely to be extracted outside. In addition, this reflection film 24 is in ohmic contact with the p-side electrode 21B and is also used as a part of the p-side electrode 21B or a part of a wire connected thereto. As a result, the resistance of the p-side electrode 21B can be decreased, and hence the operation voltage can be decreased.

(5) When $30° < \theta_1 \leq 90°$ holds, as shown in FIG. 4, the reflection film 24 is formed so as to at least include an area of the inclined surface 27 of the transparent resin layer 26, the area being formed by projecting the end surface 25 in a direction perpendicular thereto on the inclined surface 27 of the transparent resin layer 26. In a manner similar to that described above, when $90° \leq \theta_1 150°$ holds, the reflection film 24 is formed so as to at least include an area of the inclined surface 27 of the transparent resin layer 26, the area being formed by projecting the end surface 25 on the inclined surface 27 of the transparent resin layer 26 through a first path in a direction perpendicular to the end surface 25 and a second path toward the inclined surface 27 after the first path is reflected on the bottom surface of the first GaN-based compound layer 23. Accordingly, since most of light generated from the active layer 16 and emitted from the end surface 25 is reflected by this reflection film 24 and goes downward, the light is likely to be extracted outside.

(6) The reflection film 24 is formed not only on the transparent resin layer 26 on the end surface 25 but also on the transparent resin layer 26 on the top surface of the second GaN-based compound layer 29 and on the p-side electrode 21B. Accordingly, besides the light generated from the active layer 16 and emitted from the end surface 25, light emitted from the top surface of the second GaN-based compound layer 29 is also reflected by the reflection film 24 and goes downward, and hence the light is likely to be extracted outside.

Figure 5:
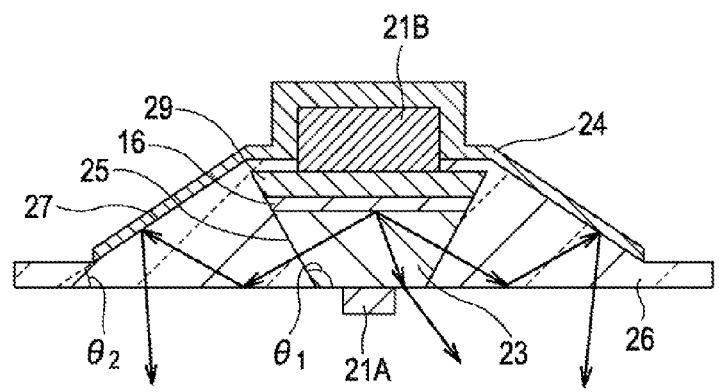
FIG. 5 is a view illustrating the structure of a GaN-based semiconductor light-emitting element ($\theta_1>90°$), according to an embodiment.

(7) In addition, in the range of $30° \leq \theta_1 \leq 150°$, $\theta_1$ and $\theta_2$ are selected so that when $30° \leq \theta_1 \leq 90°$ holds, $\theta_2 \geq (\theta_1 - \sin^{-1}(n_3/n_2))/2$ and $\theta_2 \leq \theta_1/2$ hold, and when $90° \leq \theta_1 \leq 150°$ holds, $\theta_2 \geq ((\theta_1 - 90) - \sin^{-1}(n_3/n_2))/2$ and $\theta_2 \leq (\theta_1 - 90)/2$ hold. In this case, $n_3$ indicates the refractive index of an exterior medium in contact with the bottom surface of the transparent resin layer 26. When $\theta_1 > 90°$ holds, light total-reflected on the light-extraction surface is incident on the reflection film 24. As shown in FIG. 4 or 5, the above $\theta_2 \geq (\theta_1 - \sin^{-1}(n_3/n_2))/2$ or $\theta_2 \geq ((\theta_1 - 90) - \sin^{-1}(n_3/n_2))/2$ indicates the condition in which light emitted from the end surface 25 in a direction perpendicular thereto is not total-reflected at the interface between the transparent resin layer 26 and the exterior medium. In addition, the above $\theta_2 \leq \theta_1/2$ or $\theta_2 \leq (\theta_1 - 90)/2$ indicates the condition in which light is not incident on the end surface 25 from the transparent resin layer 26 side.

(8) The n-side electrode 21A is formed in a region formed by projecting the top surface of the second GaN-based compound layer 29 in a direction perpendicular thereto on the bottom surface of the first GaN-based compound layer 23. Accordingly, the following advantages can be obtained. That is, in this GaN-based light-emitting element ($\theta_1 < 90°$), most of light, which is generated from the active layer 16, is reflected by the end surface 25 to go downward, and is extracted outside, is concentrated in a region formed by projecting the end surface 25 on the bottom surface of the first GaN-based compound layer 23. When the n-side electrode 21A is formed in the above region, since light to be extracted outside is blocked by this n-side electrode 21A, loss of light quantity is generated. Hence, the n-side electrode 21A is preferably formed in a region other than that described above, that is, in a region formed by projecting the top surface of the second GaN-based compound layer 29 in a direction perpendicular thereto on the bottom surface of the first GaN-based compound layer 23, and within this region, the n-side electrode 21A may be freely formed.

Dimensions, materials, and the like of this GaN-based light-emitting element ($\theta_1<90°$) are as described below by way of example. For example, the thickness of the first GaN-based compound layer 23 is 2,600 nm, the thickness of the active layer 16 is 200 nm, and the second GaN-based compound layer 29 is 200 nm.

The active layer 16 has, for example, a multi-quantum well (MQW) structure formed of InGaN well layers and GaN barrier layers, and the In composition of the InGaN well layer is, for example, 0.17 when the GaN-based light-emitting element ($\theta_1<90°$) performs blue light emission, and is, for example, 0.25 when the GaN-based light-emitting element ($\theta_1<90°$) performs green light emission.

The maximum diameter a of the GaN-based light-emitting element ($\theta_1<90°$) is, for example, 20 µm. When the thickness of the first GaN-based compound layer 23 is 2,600 nm, and the thickness of the active layer 16 and that of the second GaN-based compound layer 29 are each 200 nm, as described above, the total thickness of this GaN-based light-emitting element ($\theta_1<90°$) is (2,600+200+200)=3,000 nm=3 µm. In this case, the aspect ratio b/a of the GaN-based light-emitting element ($\theta_1<90°$) is 3/20=0.15.

For example, $\theta_1$ is 50°. When the refractive index $n_2$ of the transparent resin layer 26 is, for example, 1.6, and for example, when this transparent resin layer 26 is formed by a spin coating method so that an as-coated thickness is approximately 1 µm at the flat portion, and the thickness is decreased to 70% thereof by curing shrinkage, $\theta_2$ is, for example, 20°.

The p-side electrode 21B is formed of a metal multilayer film having, for example, an Ag/Pt/Au structure, the thickness of the Ag film is, for example, 50 nm, the thickness of the Pt film is, for example, 50 nm, and the thickness of the Au film is, for example, 2,000 nm. The p-side electrode 21B may also be a single layer film of Ag.

The reflection film 24 is formed, for example, of a metal multilayer film having an Ag/Au structure, and the thickness of the Ag film and that of the Au film are each, for example, 50 nm. The reflection film 24 may be a single layer film of Ag.

The n-side electrode 21A is formed, for example, of a metal multilayer film having a Ti/Pt/Au structure, the thickness of the Ti film and that of the Pt film are each, for example, 50 nm, and the thickness of the Au film is, for example, 2,000 nm.

In the GaN-based light-emitting element ($\theta_1<90°$), light generated from the active layer 16 during the operation is reflected by the end surface 25 and is then extracted outside from the bottom surface of the first GaN-based compound layer 23; light generated from the active layer 16 during the operation is emitted from the end surface 25 and the top surface of the second GaN-based compound layer 29, is then reflected by the reflection film 24, and is then extracted outside from the bottom surface of the transparent resin layer 26; or light generated from the active layer 16 during the operation goes directly to the bottom surface of the first GaN-based compound layer 23 and is then extracted outside. Hence, in this case, the individual portions are optimized in order to maximize the light-extraction efficiency, the light quantity extracted outside from the GaN-based light-emitting element ($\theta_1<90°$) is significantly large.

FIG. 5 is a cross-sectional view illustrating the structure of a GaN-based semiconductor light-emitting element ($\theta_1>90°$) of the embodiment.

As shown in FIG. 5, in the GaN-based light-emitting element ($\theta_1>90°$) 1, the cross-sectional shape in the diameter direction of the first GaN-based compound layer 23, the active layer 16, and the second GaN-based compound layer 29 is an inverted trapezoid shape ($\theta_1>90°$).

In the GaN-based light-emitting element ($\theta_1>90°$), compared to the GaN-based light-emitting element ($\theta_1<90°$) shown in FIG. 4, since the diameter of the second GaN-based compound layer 29 can be increased, the diameter of the p-side electrode 21B can be increased. Hence, the current density can be decreased, the luminance saturation can also be prevented, and the contact resistance of the p-side electrode 21B can also be decreased, so that the operation voltage can be decreased.

As described above, by optimizing the structure of the GaN-based light-emitting element, the light-extraction efficiency can be maximized, and the light-emission efficiency can be significantly improved. According to the above GaN-based light-emitting element, for example, approximately 61.7% of light generated in the active layer 16 can be extracted from the bottom surface of the first GaN-based compound layer 23. In addition, since the above GaN-based light-emitting element has a structure which can be suitably miniaturized, for example, a significantly small element having a size of several tens of micrometers or less can be easily obtained.

The above GaN-based light-emitting element can be formed for blue color emission, green color emission, or red color emission, and a light-emitting diode display, a light-emitting diode backlight, a light-emitting diode lighting device, and the like can be realized. In addition, the above GaN-based light-emitting element can be used, for example, for display and lighting of various electronic devices, such as a mobile phone. The above GaN-based light-emitting element may be used as a light-emitting diode for blue light emission or green light emission, and as a light-emitting diode for red light emission, an AlGaInP-based semiconductor light-emitting element for red light emission may be used.

In addition, the above GaN-based semiconductor element may be operated as a light-receiving element, and in this case, according to the structures shown in FIGS. 4 and 5, a high light-absorption efficiency (light-receiving efficiency) of a light-receiving element can be realized.

A plurality of GaN-based semiconductor elements, each of which is according to this embodiment, may be disposed in a two-dimensional matrix to form an optical device.

In the optical device described above, first electrodes of the plurality of GaN-based semiconductor elements disposed in lines in a first direction are connected to common wires of the respective lines, and second electrodes of the plurality of GaN-based semiconductor elements disposed in lines in a second direction are connected to common wires of the respective lines.

In an image display apparatus having a pixel portion which is formed of the optical device as described above, the GaN-based semiconductor elements are passive matrix driven. The image display apparatus preferably has a structure containing at least 100 thousand GaN-based semiconductor elements described above and more preferably has a structure containing at least one million GaN-based semiconductor elements described above.

In addition, in a two-dimensional light-receiving apparatus having a light receiving portion formed of the optical device as described above, the GaN-based semiconductor elements are passive matrix driven.

In an image display apparatus having a plurality of light-emitting elements disposed in a matrix, for example, since 640×480 dots are necessary in VGA (Video Graphics Array), when three light-emission wavelengths, R (red), G (green), and B (blue), are used, approximately 920 thousands light-emitting elements are to be disposed.

As one method for supplying image signals to the image display apparatus as described above, a drive system by a simple matrix method (also called "passive matrix method") may be mentioned. By this drive system, X wires disposed along an X axis direction and Y wires disposed along a Y axis direction are formed, and by applying a voltage in the X axis direction and the Y axis direction, a light-emitting element connected to an X wire and a Y wire, which are selected and intersect each other, is driven. By the simple matrix method, since the structure is simple, advantages, such as low cost and high yield, can be obtained.

In applications of a related outdoor LED display (this type of display is divided into sections, the sections are separately driven, and the number of elements provided in each section is relatively small) and other general LED, a leakage current which is smaller than a drive current by several orders of magnitude has hardly caused a problem; however, when at least 100 thousand or at least one million elements are drive by a simple matrix method, it is necessary to pay attention to the leakage current and to suppress it.

When light-emitting elements are driven by a simple matrix method, since a light-emitting element which is not driven is maintained so as not to emit light by reverse bias application, when a reverse bias is applied, the leakage current generated in each light-emitting element becomes a problem.

In the simple matrix method, in order to simplify the wiring, since the X wires and the Y wires function as common wires for light-emitting elements disposed in a matrix, even if the leakage current is small per one element, the total leakage current becomes close to the product of the number of elements and the leakage current of each element.

For example, even when the leakage current is 1 μA per one light-emitting element, in the case of the above VGA, the total current becomes very large, such as approximately 1 A. In the state as described above, light emission may not be expected, and large part of the electric power supplied to the image display apparatus is meaninglessly spent as a leakage current. Hence, it is difficult to use a light-emitting element having a large leakage current for an image display apparatus. In addition, when the above light-emitting element is used for an image display apparatus having a very large number of pixels, besides an increase in power consumption caused by the leakage current, a problem of degradation in quality may arise due to crosstalk and the like.

Figure 6:
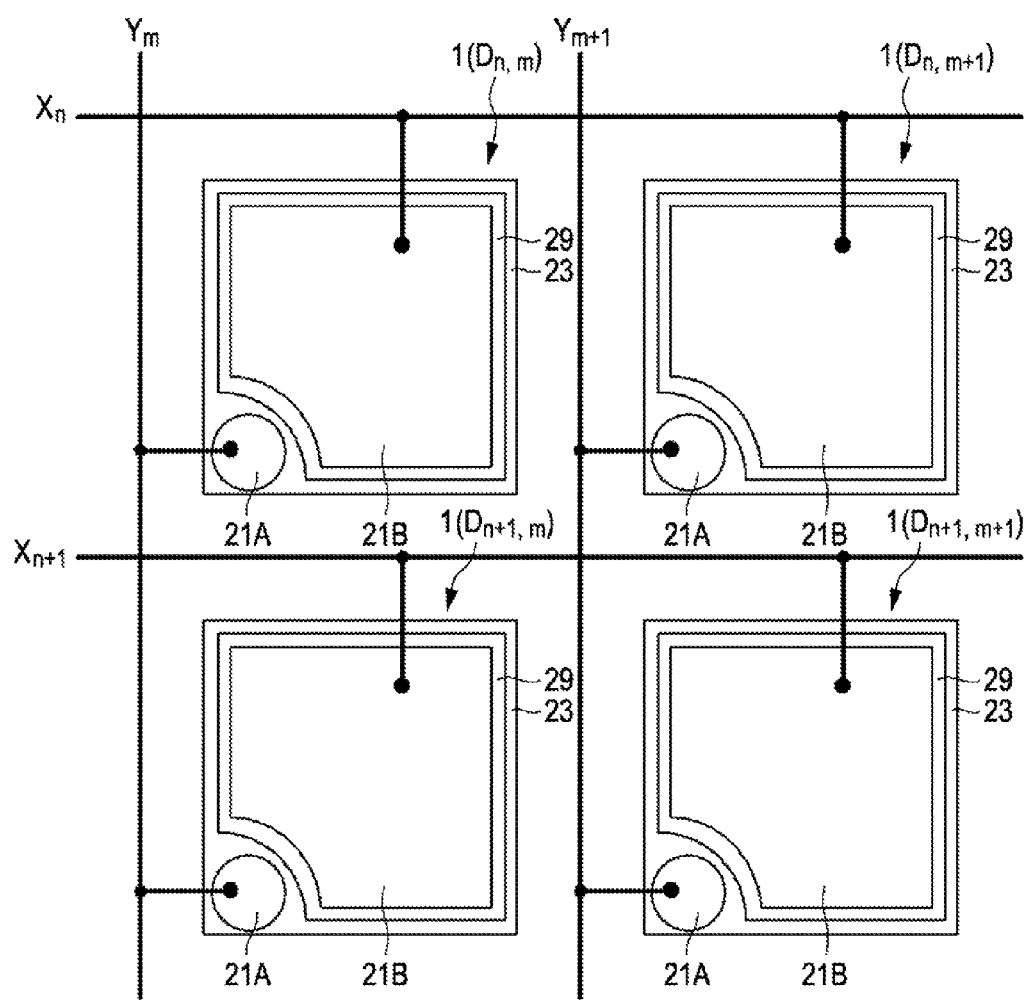
FIG. 6 is a view illustrating a partial circuit structure of a semiconductor light-emitting element device driven by a simple matrix system, according to an embodiment.

FIG. 6 is a view illustrating a partial circuit structure of a semiconductor light-emitting element device driven by a simple matrix method, according to the embodiment.

As shown in FIG. 6, GaN-based light-emitting elements ($D_{n, m}$, $D_{n, m+1}$, ~$D_{n+1, m}$, $D_{n+1, m+1}$, ~) are connected to X wires ($X_n$, $X_{n+1}$, ~) in an X direction and Y wires ($Y_m$, $Y_{m+1}$, ~) in a Y direction for driving in accordance with a simple matrix method. The p-side electrodes 21B of the GaN-based light-emitting elements ($D_{n, m}$, $D_{n, m+1}$, ~$D_{n+1, m}$, $D_{n+1, m+1}$, ~) are connected to the X wires ($X_n$, $X_{n+1}$, ~), and the n-side electrodes 21A of the GaN-based light-emitting elements ($D_{n, m}$, $D_{n, m+1}$, ~$D_{n+1, m}$, $D_{n+1, m+1}$, ~) are connected to the Y wires ($Y_m$, $Y_{m+1}$, ~).

Figure 7:
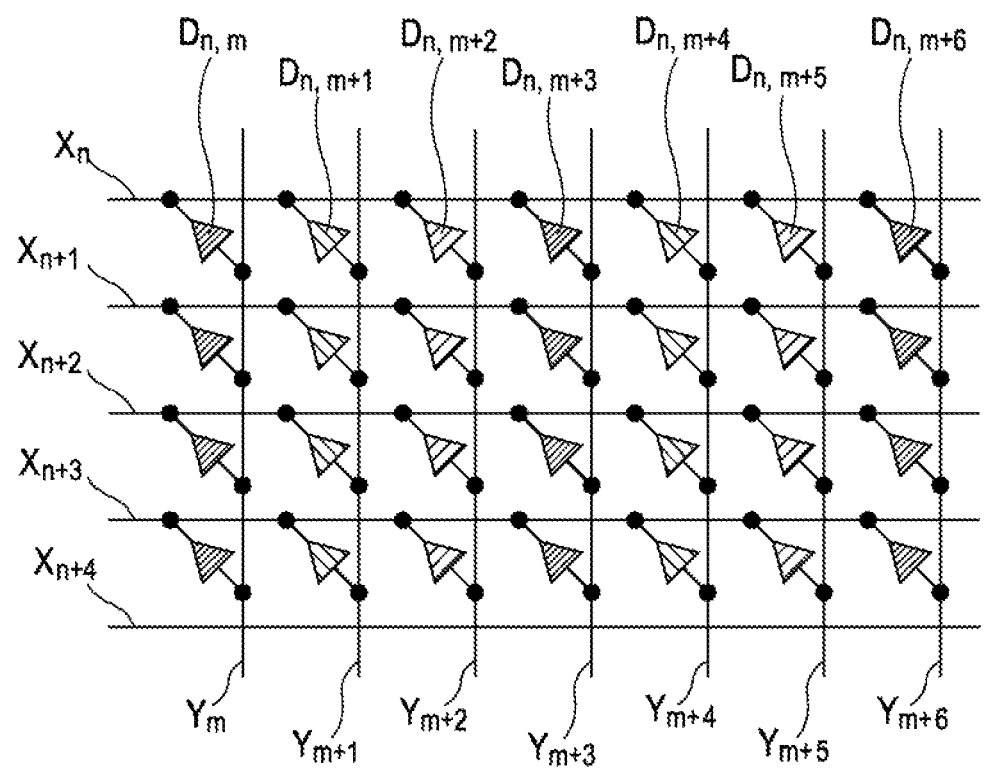
FIG. 7 is a view illustrating a partial circuit structure of a semiconductor light-emitting element device driven by a simple matrix system, according to an embodiment.

FIG. 7 is a view illustrating a partial circuit structure of a semiconductor light-emitting element device driven by a simple matrix method, according to the embodiment.

With reference to FIG. 7, the partial circuit structure of the semiconductor light-emitting element device driven by a simple matrix method will be further described in detail.

The GaN-based light-emitting elements are connected to the X wires ($X_n$, $X_{n+1}$, $X_{n+2}$, $X_{n+3}$, $X_{n+4}$, ~) in the X direction and the Y wires ($Y_m$, $Y_{m+1}$, $Y_{m+2}$, $Y_{m+3}$, $Y_{m+4}$, $Y_{m+5}$, $Y_{m+6}$, ~) in the Y direction.

For example, the p-side electrodes 21B of the GaN-based light-emitting elements ($D_{n,m}$, $D_{n, m+1}$, $D_{n, m+2}$, $D_{n, m+3}$, $D_{n, m+4}$, $D_{n, m+5}$, $D_{n, m+6}$, ~) are connected to the X wires ($X_n$); the p-side electrodes 21B of the GaN-based light-emitting elements ($D_{n+1, m}$, $D_{n+1, m+1}$, $D_{n+1, m+2}$, $D_{n+1, m+3}$, $D_{n+1, m+4}$, $D_{n+1, m+5}$, $D_{n+1, m+6}$, ~) are connected to the X wires ($X_{n+1}$); and hereinafter, in the same manner as described above, the p-side electrodes 21B of the GaN-based light-emitting elements are connected to the X wires ($X_{n+2}$, $X_{n+3}$, $X_{n+4}$, ~).

For example, the n-side electrodes 21A of the GaN-based light-emitting elements ($D_{n,m}$, $D_{n+1, m}$, $D_{n+2, m}$, $D_{n+3, m}$, $D_{n+4, m}$, ~) are connected to the Y wires ($Y_m$); the n-side electrodes 21A of the GaN-based light-emitting elements ($D_{n, m+1}$, $D_{n+1, m+1}$, $D_{n+2, m+1}$, $D_{n+3, m+1}$, $D_{n+4, m+1}$, ~) are connected to the Y wires ($Y_{m+1}$); and hereinafter, in the same manner as described above, the n-side electrodes 21A of the GaN-based light-emitting elements are connected to the Y wires ($Y_{m+2}$, $Y_{m+3}$, $Y_{m+4}$, $Y_{m+5}$, $Y_{m+6}$, ~).

In this embodiment, the GaN-based light-emitting elements are disposed to perform common light emission along lines in the Y direction, and as shown in FIGS. 6 and 7, the GaN-based light-emitting elements, which emit R (red), G (green), and B (blue), are disposed repeatedly from the left to the right in the X direction. For example, GaN-based light-emitting elements emitting R (red) are disposed along the Y wires ($Y_m$, $Y_{m+3}$, $Y_{m+6}$, ~), GaN-based light-emitting elements emitting G (green) are disposed along the Y wires ($Y_{m+1}$, $Y_{m+4}$, $Y_{+7}$, ~), and GaN-based light-emitting elements emitting B (blue) are disposed along the Y wires ($Y_{m+2}$, $Y_{m+5}$, $Y_{m+8}$, ~). The semiconductor light-emitting element device (optical device) shown in FIGS. 6 and 7 is used as an image display apparatus.

Although all light-emitting elements emitting R (red), G (green), and B (blue) may be formed of GaN-based light-emitting elements, light-emitting elements emitting G (green) and B (blue) are formed of GaN-based light-emitting elements, and light-emitting elements emitting R (red) may be formed of AlGaInP-based semiconductor light-emitting elements.

That is, when wiring is performed in accordance with a simple matrix method, in this embodiment, all light-emitting elements may not be GaN-based light-emitting elements, and among the light-emitting elements disposed in a matrix, some of them may be formed of GaN-based light-emitting elements.

When the optical device is used as an image display apparatus, and when the image display apparatus is driven by a simple matrix method as shown in FIGS. 6 and 7, a forward bias is applied to a GaN-based light-emitting element connecting between an X wire and a Y wire, which are selected based on a necessary image signal, and a reverse bias is applied to the other GaN-based light-emitting elements.

In this embodiment, since the Si doping concentration of the underlayer 14 of the GaN-based semiconductor element shown in FIG. 2 is set to $3 \times 10^{18}/cm^3$ or more, the leakage current density can be decreased to $2 \times 10^{-5}/cm^2$ or less; since the Si doping concentration is preferably set to $4 \times 10^{18}/cm^3$ or more, the leakage current density can be decreased to $8 \times 10^{-6}/cm^2$ or less; since the Si doping concentration is more preferably set to $8 \times 10^{18}/cm^3$ or more, the leakage current density can be decreased to $1 \times 10^{-6}/cm^2$ or less; and furthermore, since the Si doping concentration is even more preferably set to $1 \times 10^{19}/cm^3$ or more, the leakage current density can be decreased to $6 \times 10^{-7}/cm^2$ or less.

As described above, when a reverse bias is applied, that is, when the apparatus is driven, the leakage current of the GaN-based semiconductor elements (GaN-based semiconductor light-emitting elements or GaN-based semiconductor light-receiving elements), which are not selected, can be decreased, degradation of properties caused by crosstalk is prevented, and at the same time, an increase in power consumption is suppressed, so that a GaN-based semiconductor element having stable and preferable operation properties can be realized.

Next, for the purpose of explanation, a monochrome image display apparatus in which 160×120 (QQVGA) light-emitting elements are simple matrix wired will be described as a simpler display. Since a minute leakage current is present in a light-emitting element itself, leakage by a forward bias is generated in 159 (160-1) or 119 (120-1) light-emitting elements which are commonly wired from a circuit point of view, and at the same time, leakage by a reverse bias is generated in remaining 18,921 (160×120−(159+119)) light-emitting elements.

For example, when the drive current density is in the range of 10 to 100 A/cm$^2$, the leakage current density per one element during reverse bias application is (10 to 100 A/cm$^2$)/18,921, that is, approximately (0.5 to 5) mA/cm$^2$, and when the leakage current density per one light-emitting element during reverse bias application is larger that this approximately (0.5 to 5) mA/cm$^2$, all current which is made to flow is consumed as the leakage current; as a result, it becomes difficult to perform desired light emission. Hence, it is necessary to suppress the leakage current density to approximately one twenty thousandth or less of the drive current density.

Furthermore, when a contrast ratio of 1:500 or more is necessary, it is desired to decrease the leakage current density to one ten-millionth (that is, 1 to 10 µA/cm$^2$) or less of the drive current density. In this case, in order to decrease the leakage current density to one ten-millionth (that is, 1 to 10 µA/cm$^2$) or less of the drive current density, from the results shown in FIG. 1, the Si doping concentration of the underlayer 14 shown in FIG. 2 is effectively set to ($8 \times 10^{18}$ to $3 \times 10^{18}/cm^3$) or more, and the leakage current flowing out of a light-emitting element during reverse bias application can be effectively decreased.

The case in which the drive current density is set to 10 to 100 A/cm$^2$ and the contrast ratio is maintained to be 1:500 or more is described above using a monochrome QQVGA image display apparatus by way of example, and in the case of a QQVGA image display apparatus for RGB color display, in a manner similar to that described above, the leakage current density is necessarily decreased to (0.35 to 3.5 µA/cm$^2$) or less. In order to satisfy the above condition, from the results shown in FIG. 1, the Si doping concentration of the underlayer 14 shown in FIG. 2 may be set to ($1 \times 10^{19}$ to $4 \times 10^{18}/cm^3$) or more.

In a manner similar to that described above, in the case of a QVGA image display apparatus for RGB color display, the leakage current density is necessarily decreased to (0.1 to 0.9 µA/cm$^2$) or less. In order to satisfy the above condition, from the results shown in FIG. 1, the Si doping concentration of the underlayer 14 shown in FIG. 2 may be set to ($1.5 \times 10^{19}$ to $8 \times 10^{18}/cm^3$) or more.

In a manner similar to that described above, when the drive current density is set to 100 A/cm$^2$ and the contrast ratio is maintained to be 1:500 or more, in the case of a VGA, a SVGA, and a WVGA image display apparatus for RGB color display, the leakage current density is necessarily decreased to 0.22 µA/cm$^2$ or less, 0.14 µA/cm$^2$ or less, and 0.17 µA/cm$^2$ or less, respectively. In order to satisfy the above conditions, from the results shown in FIG. 1, the Si doping concentration of the underlayer 14 shown in FIG. 2 may be set to $1.5 \times 10^{19}/cm^3$ or more.

As described above, a very large number of GaN-based light-emitting elements are disposed in a matrix, one side electrodes of the GaN-based light-emitting elements are connected to respective common wires, and the other side electrodes are also connected to respective common wires. Subsequently, a signal based on a necessary image signal is supplied to electrodes commonly wired, and current is supplied based on the image signal to each GaN-based light-emitting element, so that light emission can be performed. In accordance with the number of GaN-based light-emitting elements forming an image display apparatus, since the Si doping concentration of the underlayer 14 is determined based on the results shown in FIG. 1, the leakage current flowing out of a light-emitting element during reverse bias application can be effectively decreased.

According to the embodiment, also in an image display apparatus having a very large number of pixels, an increase in power consumption caused by the leakage current can be solved, and at the same time, degradation in image quality caused by crosstalk can also be solved. Hence, in an image display apparatus, in particular, in which individual pixels are independently driven, the image quality thereof can be improved, and a decrease in power consumption can also be realized.

Although the image display apparatus of this embodiment is not particularly limited, the size of a GaN-based light-emitting element can be decreased, for example, to a very small light-emitting element having a size of approximately 100 µm or less. In addition, although the number of light-emitting elements commonly connected is not particularly limited, for example, an image display apparatus including at least one million elements may be formed.

In this embodiment, as the optical device, the image display apparatus capable of emitting multicolor light is described by way of example; however, the present invention may be applied to a monochrome image display apparatus, a lighting device capable of changing emission colors, and the like. In addition, in this embodiment, although the active layer has a multi-quantum well structure, a single quantum well structure may also be formed.

Figure 8A:
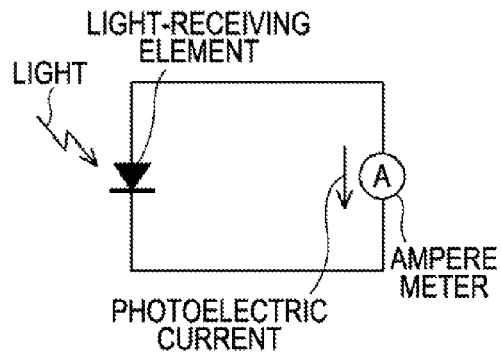
FIGS. 8A to 8C are views each illustrating operation control of a GaN-based semiconductor light-receiving element, according to an embodiment.
Figure 8B:
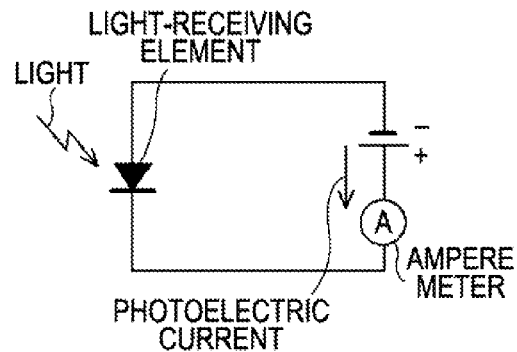
Figure 8C:
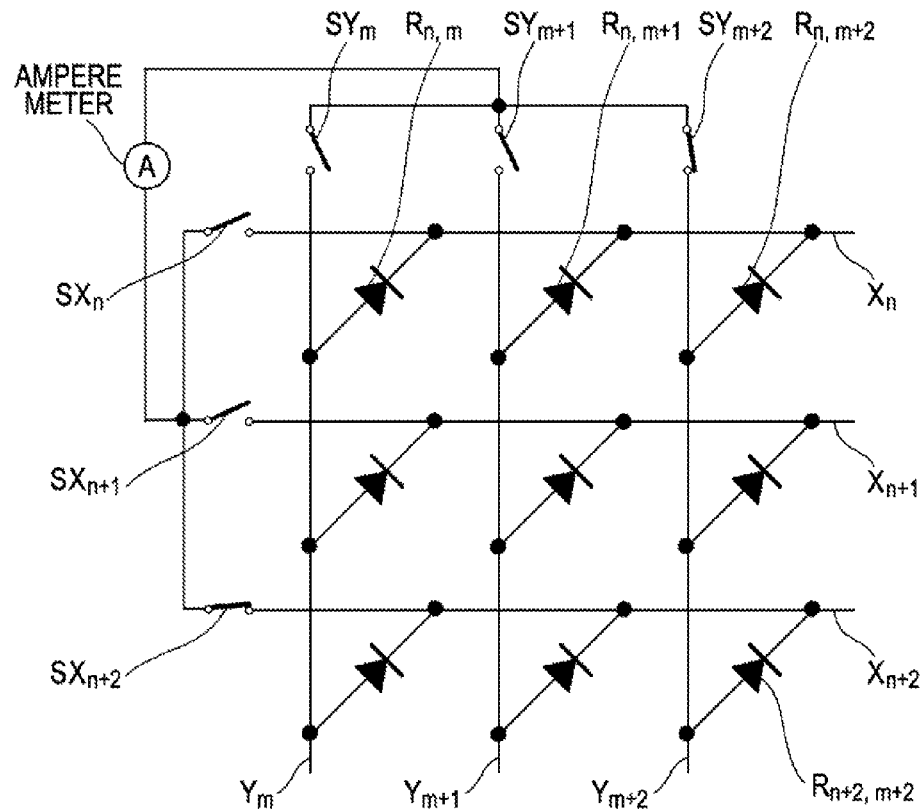

FIGS. 8A to 8C are views illustrating operation control of a GaN-based semiconductor light-receiving element of the embodiment; FIG. 8A is a view showing light detection by no bias application; FIG. 8B is a view showing light detection during reverse bias application; and FIG. 8C is a view showing a partial circuit structure of a light-receiving device operated and controlled by a simple matrix method.

Light detection by a GaN-based semiconductor light-receiving element (hereinafter also referred to as "GaN-based light-receiving element") is performed in the state in which no bias voltage is applied as shown in FIG. 8A or in the state in which a reverse bias is applied as shown in FIG. 8B for rapid response and/or improvement in light-receiving sensitivity. In general, in a GaN-based light-receiving element, even when the light-receiving element is placed in a dark state so that an active layer (light-receiving layer) thereof is not irradiated with light, a dark current (leakage current) flows and generates a background noise. Hence, when a reverse bias is applied to a light-receiving element, if a dark current is present, the ratio S/N is not improved. When this dark current is suppressed, the ratio S/N of the light-receiving element is improved thereby.

As shown in FIG. 8C, similar to the GaN-based light-emitting element shown in FIGS. 6 and 7, GaN-based light-receiving elements are connected to X wires ($X_n$, $X_{1+1}$, $X_{n+2}$, ~) in an X direction and Y wires ($Y_m$, $Y_{m+1}$, $Y_{m+2}$, ~) in a Y direction. In FIGS. 8A to 8C, although a particular structure of the GaN-based light-receiving element is not shown, the individual GaN-based light-receiving elements are formed to have a similar structure to that of the individual GaN-based light-emitting elements shown in FIGS. 1 to 6.

For example, p-side electrodes 21B of GaN-based light-receiving elements ($R_{n, m}$, $R_{n, m+1}$, $R_{n, m+2}$, ~) are connected to X wires ($X_n$); p-side electrodes 21B of GaN-based light-receiving elements ($R_{n+1, m}$, $R_{n+1, m+1}$, $R_{b+1, m+2}$, ~) are connected to X wires ($X_{n+1}$); and hereinafter, in a manner similar to that described above, p-side electrodes 21B of GaN-based light-receiving elements are connected to X wires ($X_{n+2}$, $X_{n+3}$, $X_{n+4}$, ~).

For example, n-side electrodes 21A of the GaN-based light-receiving elements ($R_{n, m}$, $R_{n+1, m}$, $R_{n+2, m}$, ~) are connected to Y wires ($Y_m$); n-side electrodes 21A of the GaN-based light-receiving elements ($R_{n, m+1}$, $R_{n+1, m+1}$, $R_{n+2, m+1}$, ~) are connected to Y wires ($Y_{m+1}$); and hereinafter, in a manner similar to that described above, n-side electrodes 21A of the GaN-based light-receiving elements are connected to Y wires ($Y_{m+2}$, $Y_{m+3}$, $Y_{m+4}$, ~).

In addition, as shown in FIG. 8C, X wire switches ($SX_n$, $SX_{n+1}$, $SX_{n+2}$, ~) are provided in the X wires ($X_n$, $X_{n+1}$, $X_{n+2}$, ~), respectively, and Y wire switches ($SY_m$, $SY_{m+1}$, $SY_{m+2}$, ~) are provided in the Y wires ($Y_m$, $Y_{m+1}$, $Y_{m+2}$, ~), respectively. That is, the switch $SX_n$, the switch $SX_{n+1}$, the switch $SX_{n+2}$, ~ are provided in the X wire $X_n$, the X wire $X_{n+1}$, the X wire $X_{n+2}$, ~, respectively, and the switch $SY_m$, the switch $SY_{m+1}$, the switch $SY_{m+2}$, are provided in the Y wire $Y_m$, the Y wire $Y_{m+1}$, the Y wire $Y_{m+2}$, ~, respectively.

Light detection by the GaN-based light-receiving elements disposed in a two-dimensional matrix is operated and controlled using a simple matrix method by ON-OFF control of the X wire switches ($SX_n$, $SX_{n+1}$, $SX_{n+2}$, ~) and that of the Y wire switches ($SY_m$, $SY_{m+1}$, $SY_{m+2}$, ~) shown in FIG. 8C. In the state shown in FIG. 8C, the switch $SX_{n+2}$ of the X wire switches ($SX_n$, $SX_{n+1}$, $SX_{n+2}$, ~) is placed in an ON state, and the other switches are placed in an OFF state; and the switch $SY_{m+2}$ of the Y wire switches ($SY_m$, $SY_{m+1}$, $SY_{m+2}$, ~) is placed in an ON state, and the other switches are placed in an OFF state. Hence, a GaN-based light-receiving element $R_{n+2, m+2}$ is selected as a light-receiving element which performs light detection, and a photoelectric current generated by light absorption is measured by an ampere meter.

In addition, although operation of the GaN-based light-receiving elements is controlled by a simple matrix method, and light detection is sequentially performed at different places by light-receiving elements connected to X wires and Y wires, which are selected and intersect each other, all the GaN-based light-receiving elements are placed in the state in which no bias voltage is applied (FIG. 8A) or in the state in which a reverse bias is applied (FIG. 8B).

The case in which the GaN-based semiconductor elements (GaN-based semiconductor light-emitting elements or GaN-based semiconductor light-receiving elements) are disposed in a two-dimensional matrix is described above. However, also in the case in which GaN-based semiconductor elements are connected to the same common wire in one-dimensional manner, for example, when a voltage is applied in a reverse bias direction to the semiconductor elements in a standby state as in the case of the above two-dimensional matrix arrangement, since the leakage current is increased in proportional to the number of the elements, power consumption is increased when the leakage current is large, and as a result, a circuit to which the elements are connected may be damaged depending on its circuit structure. In general, a protection element (rectifier, diode, or the like) may be additionally provided at the circuit side in some cases; however, the circuit becomes complicated, and cost is unfavorably increased.

Although being dependent on a manufacturing temperature history, since the GaN-based semiconductor element (GaN-based semiconductor light-emitting element or GaN-based semiconductor light-receiving element) has heat resistance against a high temperature of 700 to 1,400° C. and corrosion resistance against corrosive gases, such as ammonia, it can be used as an element operable under conditions in which heat resistance and/or corrosion resistance are necessary.

EXAMPLES

Hereinafter, measurements of the leakage current density and the Si doping concentration of the underlayer 14 of the GaN-based semiconductor light-emitting element of the embodiment according to the present invention and measurement results thereof will be described in detail.

Figure 9A:
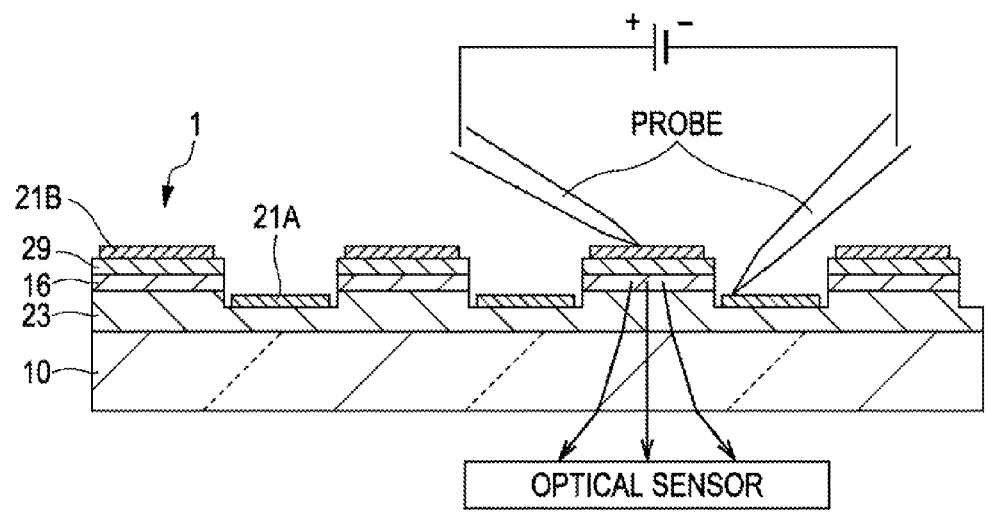
FIGS. 9A and 9B are views each illustrating an evaluation method of a GaN-based semiconductor light-emitting element of an example of the present application.
Figure 9B:
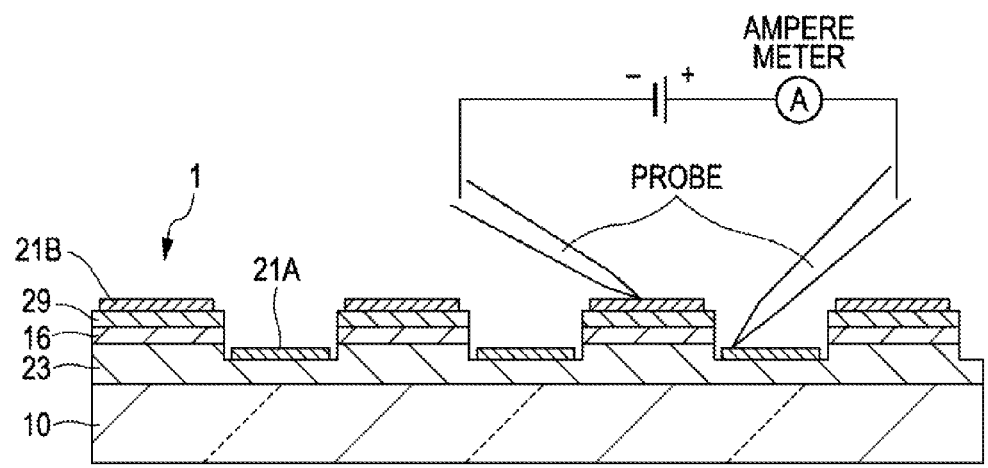

FIGS. 9A and 9B are cross-sectional views each illustrating the concept of evaluation of a GaN-based semiconductor light-emitting element of an example; FIG. 9A is a view illustrating an evaluation method of light emission intensity of the GaN-based light-emitting element; and FIG. 9B is a view illustrating an evaluation method of a leakage current of the GaN-based light-emitting element.

As shown in FIGS. 9A and 9B, for evaluation of the GaN-based light-emitting element, by using a lithographic process and an etching process, the first GaN-based compound semiconductor layer 13 (FIG. 2) having an n-type conductivity of the first GaN-based compound layer 23 is partly exposed, the p-side electrode 21B of Ag/Ni is formed on the contact layer 20 (FIG. 2) of the second GaN-based compound layer 29, and the n-side electrode 21A of Ti/Al is formed on the first GaN-based compound semiconductor layer 13 of the first GaN-based compound layer 23.

As shown in FIG. 9A, in order to evaluate the light emission intensity of the GaN-based light-emitting element, a forward bias is applied between the n-side electrode 21A and the p-side electrode 21B of the GaN-based light-emitting element 1, and the light emission intensity is detected by an optical sensor.

As shown in FIG. 9B, in order to evaluate the leakage current of the GaN-based light-emitting element, a reverse bias is applied between the n-side electrode 21A and the p-side electrode 21B of the GaN-based light-emitting element 1, and the leakage current flowing between the p-side electrode 21B and the n-side electrode 21A is detected by a picoampere meter.

Hereinafter, the measurement results of the leakage current obtained when the Si doping concentrations of the underlayer 14 were set to $2 \times 10^{18}/cm^3$, which is a general Si doping concentration, $5 \times 10^{18}/cm^3$, and $1.3 \times 10^{19}/cm^3$, which are higher than that described above, will be described.

In the buffer layer (LT-GaN layer) 11 grown on the sapphire substrate 10, threading dislocations at a concentration of approximately $5\times10^8/cm^2$ were generated, and the dislocation densities of the above three types of samples were equivalent to each other. After the layers shown in FIG. 2 were formed, activation of the p-type layers was performed by annealing in a nitrogen atmosphere, and the first GaN-based compound semiconductor layer (n-type layer) 13 is exposed by dry etching. The p-side electrode 21B of Ag/Ni and the n-side electrode 21A of Ti/Al were formed on the surface of the contact layer (p-type layer) and the exposed n-type layer 13, respectively, and the leakage current during reverse bias application was evaluated by a probe measurement (FIG. 9B). As have been disclosed in many documents, as for a method for forming the element as described above, various etching methods, etched shapes and depths, electrode materials and shapes, element sizes and shapes, and the like may be used. In addition, as an evaluation method, measurement may be performed after the steps of separating chips from a wafer, mounting the chips on packages, encapsulating the chips using an epoxy or a silicone resin to form elements such as commercially available LED's; however, as in the case of this measurement, measurement may be carried out by probing performed on a wafer.

Figure 10:
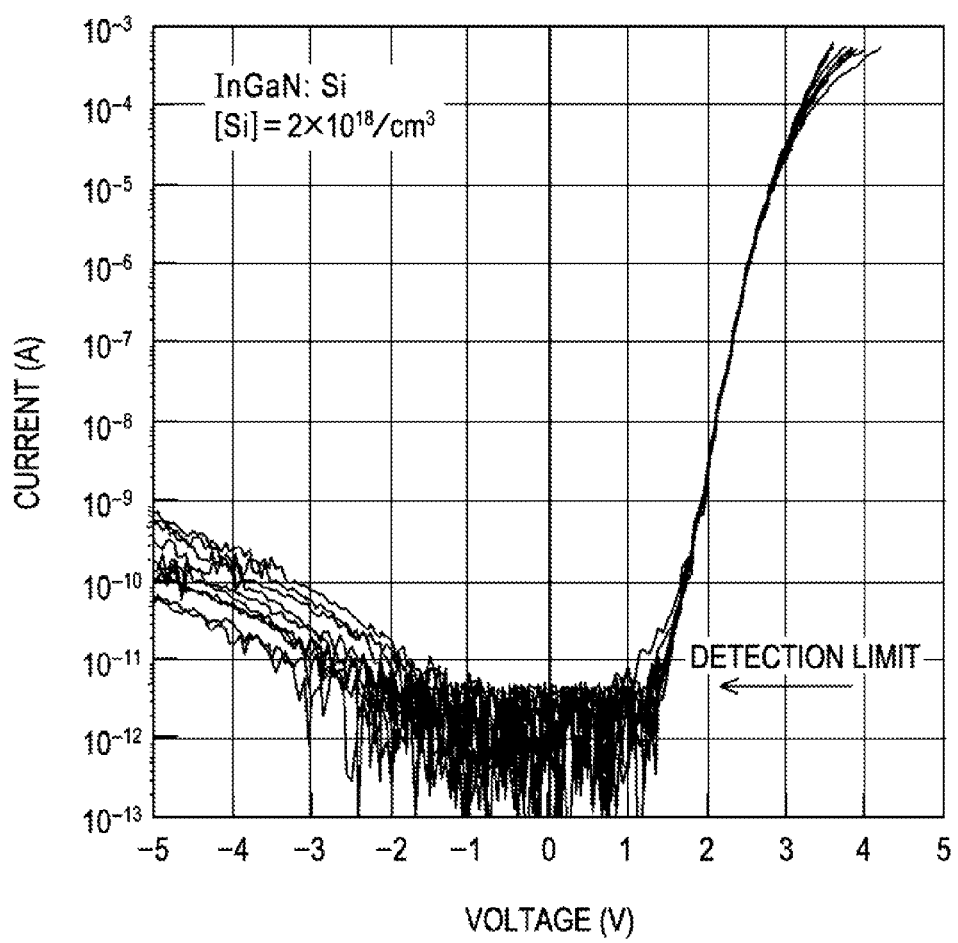
FIG. 10 is a graph illustrating I-V characteristics of GaN-based semiconductor light-emitting elements of an example of the present application.

FIG. 10 is a graph illustrating I-V characteristics of GaN-based light-emitting elements of the example, which were obtained when the Si doping concentration of the underlayer was $2\times10^{18}/cm^3$.

Figure 11:
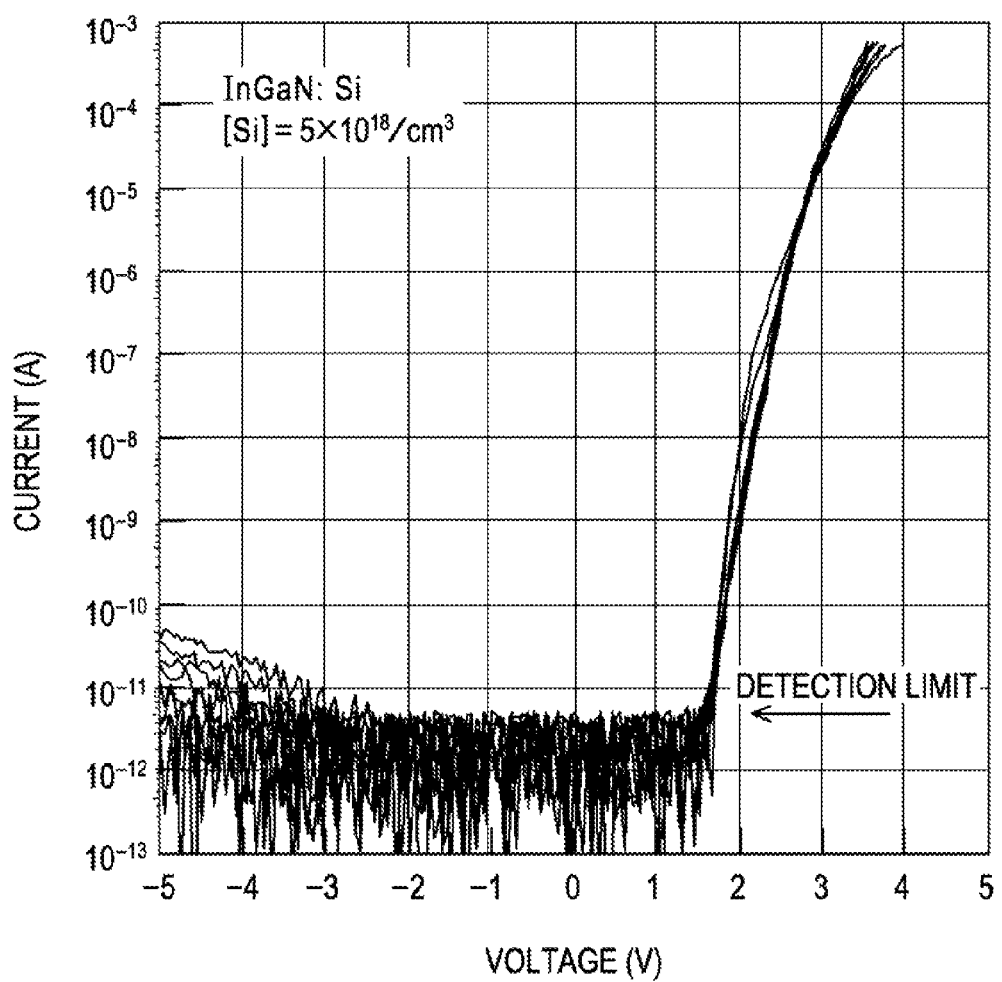
FIG. 11 is a graph illustrating I-V characteristics of GaN-based semiconductor light-emitting elements of an example of the present application.

FIG. 11 is a graph illustrating I-V characteristics of GaN-based light-emitting elements of the example, which were obtained when the Si doping concentration of the underlayer was $5\times10^{18}/cm^3$.

Figure 12:
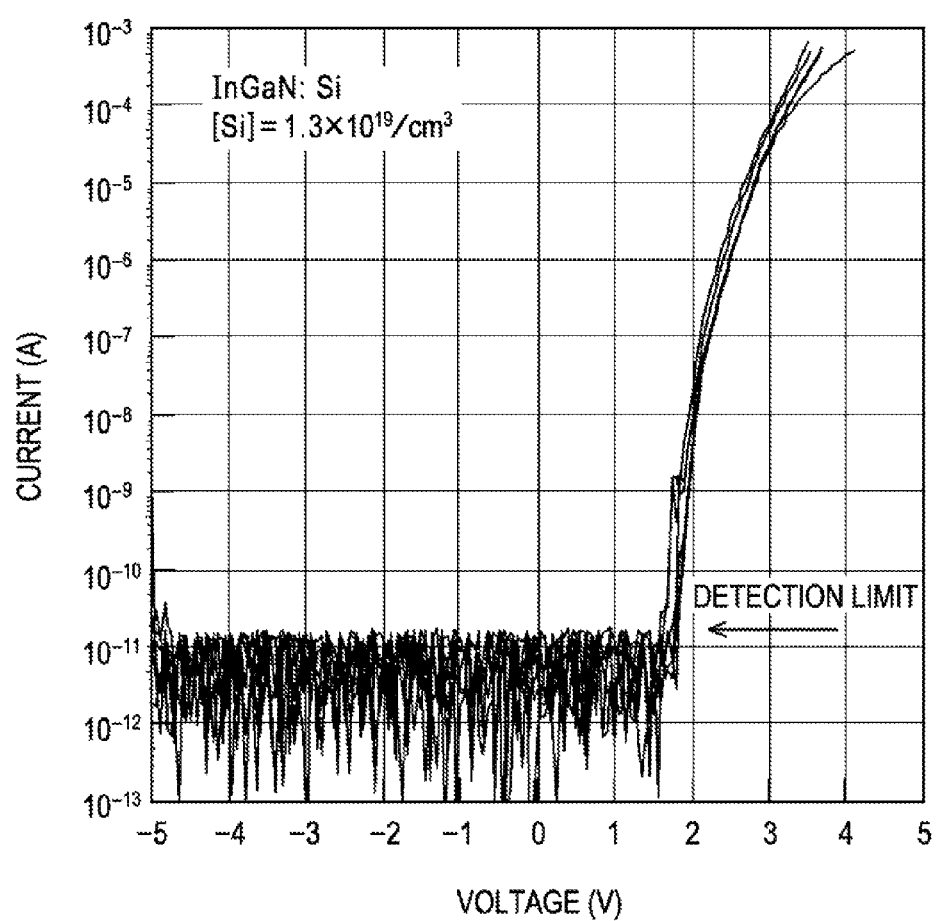
FIG. 12 is a graph illustrating I-V characteristics of GaN-based semiconductor light-emitting elements of an example of the present application.
Figure 13:
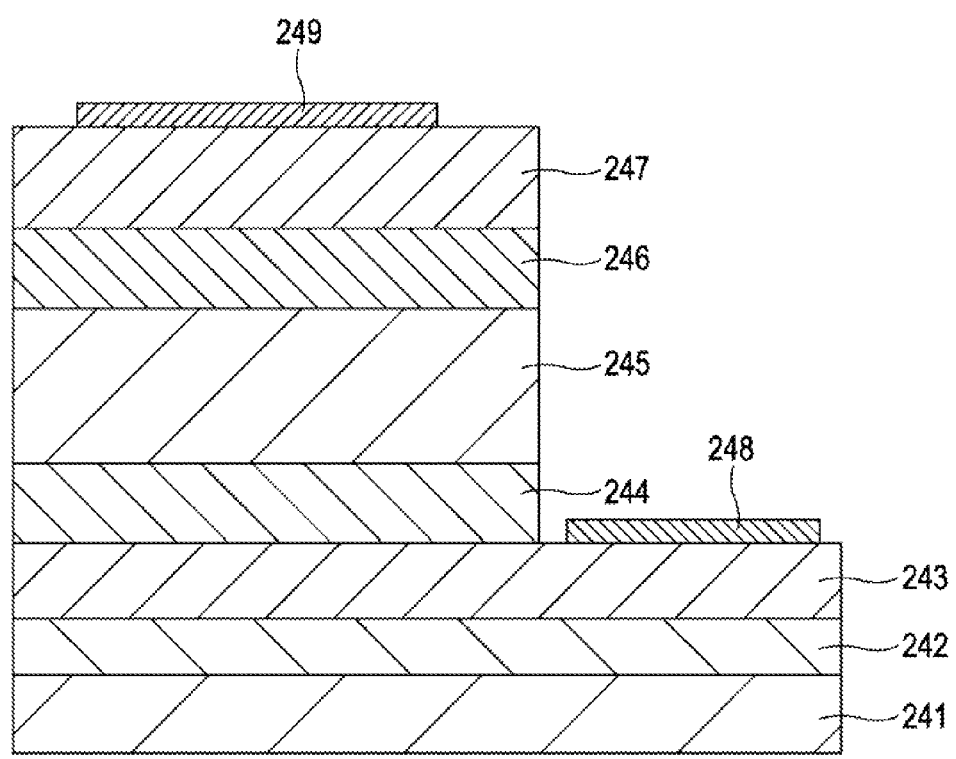
FIG. 13 is a cross-sectional view illustrating an LED element of a related art.

FIG. 12 is a graph illustrating I-V characteristics of GaN-based light-emitting elements of the example, which were obtained when the Si doping concentration of the underlayer was $1.3\times10^{19}/cm^3$.

FIGS. 10, 11, and 12 show I-V curves of the GaN-based semiconductor light-emitting elements doped with Si at room temperature (300K), the vertical axis indicates a leakage current value (A, current), and the horizontal axis indicates a bias voltage (V, Voltage). The structure of the GaN-based semiconductor light-emitting element used for the measurement shown in FIGS. 10, 11, and 12 is the same as the layer structure shown in FIG. 2, and the thicknesses of the layers of the light-emitting element are the same as those described with reference to FIG. 2.

In FIG. 10, I-V curves of 10 GaN-based semiconductor light-emitting elements each doped with Si at a concentration of $2\times10^{18}/cm^3$ are shown together; in FIG. 11, I-V curves of 9 GaN-based semiconductor light-emitting elements each doped with Si at a concentration of $5\times10^{18}/cm^3$ are shown together; and in FIG. 12, I-V curves of 6 GaN-based semiconductor light-emitting elements each doped with Si at a concentration of $1.3\times10^{19}/cm^3$ are shown together.

In addition, since a very small current is measured, the detection limit level shown in FIGS. 10, 11, and 12 depends on various environmental factors, such as electromagnetic waves, thermal noises, vibration, and light; however, the detection limit does not depend on the measurement sample.

The diameter of the active layer of the GaN-based light-emitting element used for the I-V curve measurement is 20 μm, and the area thereof is approximately $3\times10^{-6}\,cm^2$. From the I-V curves shown in FIGS. 10, 11, and 12, when the average leakage current at a reverse bias of 5 V is read and is then divided by the above active layer area, the leakage current density corresponding to Si doping concentrations of $2\times10^{18}/cm^3$, $5\times11^{18}/cm^3$, and $1.3\times10^{19}/cm^3$ are approximately $1.2\times10^{-4}\,A/cm^2$, approximately $3.2\times10^{-6}\,A/cm^2$, and approximately $3.2\times10^{-7}\,A/cm^2$, respectively, so that the results already shown in FIG. 1 are obtained.

From the I-V curves shown in FIGS. 10, 11, and 12, it is understood that in accordance with the Si doping concentration of the underlayer 14, the leakage current can be suppressed. At a Si doping concentration of $5\times10^{18}/cm^3$, which is 2.5 times a general Si doping concentration of $2\times10^{18}/cm^3$, a remarkable effect can be observed in which the leakage current is decreased by one order of magnitude or more. In addition, at a higher Si doping concentration of $1.3\times10^{19}/cm^3$, the leakage current is decreased approximately to the detection limit of this measurement. In this measurement, since an approximate proportional relationship between the leakage current and the active area is observed, and various shapes may be used for forming elements as described above, for general comparison purposes, the relationship between the doping concentration and the leakage current density obtained by dividing the leakage current by the active layer area is plotted, so that the results shown in FIG. 1 are obtained.

The above results in FIG. 1 show a significantly smaller leakage current density by orders of magnitude than approximately $2\times10^{-3}\,A/cm^2$ obtained by application of a reverse bias of 5V and at 300K shown in FIG. 2(a) of the Non-Patent Document 3 in which the leakage current of a related InGaN-based LED is investigated in detail. According to the Non-Patent Document 3, it has been disclosed that a very large number of threading dislocations at a concentration of $4\times10^9/cm^2$ are generated, approximately slightly less than 10% thereof forms V-defects, and the leakage current is influenced thereby. Since the dislocation density is $5\times10^8/cm^2$, which is smaller than the above value by one order of magnitude, it is believed that the leakage current density shown in FIG. 1 is decreased directly proportional to the dislocation density.

Although the correlation between the dislocation density and the leakage current have been disclosed in many reports, when the dislocation density is set to $5\times10^8/cm^2$, and the Si doping concentration is set to $2\times10^{18}/cm^3$ or more, it is very effective to further decrease the leakage current density. However, even when the dislocation density is high as disclosed in the Non-Patent Document 3, and/or a crystal having a high dislocation density is used, since the carrier concentration and the mobility, which are the primary doping effects, are changed without having any specific inflection point, it is believed that according to the present invention, the leakage current can be effectively decreased by adjusting the Si doping concentration of the underlayer 14.

As disclosed in a general physics textbook, a high concentration doping in the vicinity of a PN junction increases a junction electric field at the PN junction. As the primary reason causing device degradation, electromigration is mentioned, and it is estimated that a large junction electric field causes electromigration and generates a leakage current. However, in this example, results against the above estimation were confirmed by the actual measurement. In addition, although it might be estimated that when an n-type impurity itself diffuses, a high doping concentration in the vicinity of an interface of the PN junction functions as a leakage current source, a significantly decreased leakage current was actually obtained as a measurement result.

The leakage current may cause various problems in applications; hence, as described above, the leakage current density is necessarily decreased, for example, to one twenty thousandth or less (a leakage current density of (0.5 to 5) $mA/cm^2$ or less) of the drive current density (in a commercially available LED, typically 30 $A/cm^2$, and generally approximately 10 to 100 A/cm$^2$), and furthermore, in order to obtain a contrast ratio of 1:500 or more, the leakage current is preferably suppressed to one ten-millionth ($10^{-7}$) or less (a leakage current density of (1 to 10) μA/cm$^2$ or less) of the drive current density. From the results shown in FIG. 1, it is understood that a preferable doping concentration is $3\times10^{18}$/cm$^3$ or more, and a more preferable doping concentration is $8\times10^{18}$/cm$^3$ or more. In general, a Si doping concentration of up to $3\times10^{19}$/cm$^3$ in GaN or InGaN can be relatively easily obtained; however, when the Si doping concentration is more than $3\times10^{19}$/cm$^3$, the crystallinity is seriously degraded, and hence Si doping may not be easily performed.

As factors of decreasing the leakage current by the doping concentration, a phenomenon may be mentioned in which the crystallinity of GaN or InGaN is changed when a high concentration Si is contained therein, and as another probability, a phenomenon may also be mentioned in which a depletion layer in the vicinity of the active layer is narrowed by high concentration doping, and the number of deep defect levels is decreased.

The AlGaN: Mg layer 18 shown in FIG. 2 may have a superlattice structure. Although an effect of decreasing a leakage current is particularly significant during the growth on a sapphire substrate having a large number of dislocations, the same effect as described above is also expected on a GaN substrate having a low dislocation density. In addition, a decrease in leakage current during reverse bias application can be effectively obtained when many light-emitting elements are connected in parallel (some may be connected in series), and for display application, at least 100 thousand pixels are preferably used, and in the case of a full-specification hi-vision (number of pixels: 1,920×1,080), the use of at least one million pixels is most effective.

As disclosed in the Non-Patent Document 3, the leakage current is proportional to the active layer area (junction area), and when the light-emitting element area is not changed, a higher light-emission efficiency can be obtained by increasing the active layer area; however, since the active layer area is proportional to the leakage current, it is disadvantageous in terms of leakage current. However, when the Si doping concentration of the underlayer is controlled as in the embodiment, by increasing the active layer area, a high light-emission efficiency and a low leakage current can be simultaneously obtained; hence, a practical effect is significant.

In addition, when a device is formed using LED, a method of forming p and n electrodes on one of a top and a bottom surface, and a method for forming electrodes on a top and a bottom surface by peeling off a sapphire substrate or the like or by using a conductive substrate may be mentioned. When the p and the n electrodes are formed on one side surface, for example, a semitransparent p-type electrode or a flip-chip type using a reflective electrode may be used. In both cases, by a large active layer area, a drive current density is decreased, and a high light-emission efficiency can be expected; however, concomitant with the increase in active layer area, the leakage current is increased, and a problem may arise.

In addition, in the method for forming electrodes on a top and a bottom surface by using a conductive substrate or by peeling off a sapphire substrate or the like, it is not necessary to mill an active layer by etching to form one electrode, and almost the entire chip surface can be used as the active layer function area). By this method, since a larger active layer area can be ensured even if its chip external dimension is the same as that of another type of chip, the process can be simplified, and at the same time, a high efficiency can be obtained; however, the problem similar to that described above may also arise. However, when the Si doping concentration of the underlayer is controlled as in the embodiment, by increasing the active layer area, a high light-emission efficiency and a low leakage current can be simultaneously obtained, and hence a practical effect is significant. Since the p-side and the n-side electrodes are not formed on the same surface but formed on the top and the bottom surfaces, even in a miniaturized LED, the p-side and the n-side electrodes are not liable to be brought into contact with each other and are easily insulated from each other, and hence very small LED's each having a size of 100 μm square or having a diameter of 100 μm can be mounted at a high density.

As has thus been described, in the light-emitting element (light-emitting diode or laser diode) of the embodiment according to the present invention, a leakage current generated when a reverse bias is applied can be suppressed, circuit malfunction and an increase in power consumption, caused by unintentional current flow, can be suppressed, and problems, such as crosstalk, generated when many light-emitting elements are connected and controlled can be solved. In the past, it has been known that when a substrate having a low dislocation density (such as a bulk GaN substrate or a substrate which is formed by lateral direction growth on a sapphire substrate using selective growth) is used, the leakage current is decreased; however, according to the present invention, without using a particular substrate, cost reduction can be realized.

In general, a pn junction element is used as a light-receiving element as well as a light-emitting element, and light is absorbed in an active layer (such as a quantum well, a single hetero, or a double hetero layer) to generate current by a photoelectric effect. In the case of the light-receiving element as described above, the leakage current called a dark current generates background noises, and hence the ratio S/N is degraded. Even if an electric field is applied in order to increase a light-receiving sensitivity, when the dark current is increased thereby, the ratio S/N is not improved. According to the GaN-based semiconductor light-receiving element of the embodiment, since the dark current can be decreased, the ratio S/N can be improved.

Heretofore, embodiments have been described; however, the present application is not limited to the above embodiments and may be variously changed and modified without departing from the spirit and the scope of the present application.

For example, the Si concentration doped in the underlayer may be appropriately changed to obtain a desired leakage current density in accordance with applications for which the GaN-based semiconductor element is to be used. In addition, besides the structure, the thickness, the size, and the like of the individual layers forming the GaN-based semiconductor element, the shape, the size, and the like of the GaN-based semiconductor element itself may also be appropriately changed in accordance with various applications.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A gallium nitride-based semiconductor element comprising:
   a first GaN-based compound layer comprising:
   a first undoped GaN layer,
   an n-type conductive first GaN-based compound semiconductor layer formed on the undoped GaN layer,
   an underlayer formed directly on the n-type conductive first GaN-based compound semiconductor layer, and
   a second undoped GaN layer formed directly on the underlayer;
   an active layer formed on the second undoped GaN layer; and
   a second GaN-based compound layer including a p-type conductive layer formed on the active layer such that the active layer is provided between the first GaN-based compound layer and the second GaN-based compound layer,
   wherein the underlayer has an n-type impurity concentration in the range of $3\times10^{18}$ to $3\times10^{19}$/cm$^3$, and when a reverse bias of 5 V is applied, a leakage current density, which is the density of a current flowing per unit area of the active layer, is $2\times10^{-5}$ A/cm$^2$ or less.

2. The gallium nitride-based semiconductor element according to claim 1, wherein the n-type impurity concentration of the underlayer is $4\times10^{18}$/cm$^3$ or more, and the leakage current density is $8\times10^{-6}$ A/cm$^2$ or less.

3. The gallium nitride-based semiconductor element according to claim 1, wherein the n-type impurity concentration of the underlayer is $8\times10^{18}$/cm$^3$ or more, and the leakage current density is $1\times10^{-6}$ A/cm$^2$ or less.

4. The gallium nitride-based semiconductor element according to claim 1, wherein the n-type impurity concentration of the underlayer is $1\times10^{19}$/cm$^3$ or more, and the leakage current density is $6\times10^{-7}$ A/cm$^2$ or less.

5. The gallium nitride-based semiconductor element according to claim 1, wherein the underlayer and the active layer each include a GaN-based compound containing In, the atomic composition ratio of In to the sum of In and Ga (In +Ga) in the GaN-based compound forming the underlayer is 0.005 or more and is lower than that of the GaN-based compound forming the active layer.

6. The gallium nitride-based semiconductor element according to claim 1, wherein the underlayer has a thickness in the range of 5 nm to 5 μm.

7. The gallium nitride-based semiconductor element according to claim 1, wherein the underlayer has a thickness in the range of 20 nm to 1 μm.

8. The gallium nitride-based semiconductor element according to claim 1, wherein the second GaN-based compound layer includes a GaN layer doped with a p-type impurity and having a thickness of 100 nm or more.

9. The gallium nitride-based semiconductor element according to claim 1, wherein the gallium nitride-based semiconductor element is a light-emitting element.

10. An optical device comprising:
    a plurality of gallium nitride-based semiconductor elements, each of which is the gallium nitride-based semiconductor element according to claim 1, arranged in a two-dimensional matrix,
    wherein first electrodes of the gallium nitride-based semiconductor elements disposed along lines in a first direction are connected to common wires of the respective lines in the first direction, and
    second electrodes of the gallium nitride-based semiconductor elements disposed along lines in a second direction are connected to common wires of the respective lines in the second direction.

11. An image display apparatus comprising:
    a pixel portion including the optical device according to claim 10,
    wherein the gallium nitride-based semiconductor elements are passive matrix driven.

12. The gallium nitride-based semiconductor element according to claim 1, wherein the layers forming the first GaN-based compound layer and the second GaN-based compound layer are transparent to emission light wavelengths.

13. The gallium nitride-based semiconductor element according to claim 1, wherein the n-type conductive first GaN-based compound semiconductor layer forms a contact with an n-type electrode.

* * * * *